United States Patent
Xie et al.

(10) Patent No.: US 10,269,812 B1
(45) Date of Patent: Apr. 23, 2019

(54) FORMING CONTACTS FOR VFETS

(71) Applicant: GLOBALFOUNDRIES INC., Grand Cayman (KY)

(72) Inventors: Ruilong Xie, Schenectady, NY (US); Lars Liebmann, Mechanicville, NY (US); Daniel Chanemougame, Niskayuna, NY (US); Chanro Park, Clifton Park, NY (US); John H. Zhang, Altamont, NY (US); Steven Bentley, Menands, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/814,724

(22) Filed: Nov. 16, 2017

(51) Int. Cl.
| | |
|---|---|
| *H01L 27/112* | (2006.01) |
| *H01L 29/10* | (2006.01) |
| *H01L 21/8234* | (2006.01) |
| *H01L 27/24* | (2006.01) |
| *H01L 29/78* | (2006.01) |
| *H01L 29/808* | (2006.01) |
| *H01L 45/00* | (2006.01) |
| *H01L 29/66* | (2006.01) |
| *H01L 29/06* | (2006.01) |
| *H01L 23/522* | (2006.01) |
| *H01L 21/02* | (2006.01) |

(52) U.S. Cl.
CPC .......... *H01L 27/11273* (2013.01); *H01L 21/823487* (2013.01); *H01L 23/522* (2013.01); *H01L 27/2454* (2013.01); *H01L 29/0676* (2013.01); *H01L 29/1087* (2013.01); *H01L 29/66666* (2013.01); *H01L 29/7827* (2013.01); *H01L 29/7835* (2013.01); *H01L 29/8083* (2013.01); *H01L 45/1233* (2013.01); *H01L 21/02697* (2013.01); *Y10S 977/938* (2013.01)

(58) Field of Classification Search
CPC .......... H01L 29/0676; H01L 45/1233; H01L 27/11273; H01L 27/2454
See application file for complete search history.

(56) References Cited

U.S. PATENT DOCUMENTS

| | | | |
|---|---|---|---|
| 5,512,517 A | 4/1996 | Bryant | |
| 6,861,701 B2 | 3/2005 | Williams et al. | |
| 9,530,866 B1 | 12/2016 | Zhang et al. | |
| 9,536,793 B1 | 1/2017 | Zhang et al. | |
| 9,640,636 B1 | 5/2017 | Bentley et al. | |
| 2016/0268382 A1* | 9/2016 | Colinge | H01L 29/267 |

* cited by examiner

*Primary Examiner* — Selim U Ahmed
*Assistant Examiner* — Evan G Clinton
(74) *Attorney, Agent, or Firm* — Gibb & Riley, LLC; Anthony J. Canale

(57) ABSTRACT

A first vertical field effect transistor (VFET) and a second VFET are formed on a substrate. The VFETs are parallel and adjacent to one another, and each comprises: a fin-shaped semiconductor; a lower source/drain (S/D) element; an upper S/D element; and a gate conductor. A portion of a gate conductor of the second VFET that is positioned over a lower S/D element of the second VFET is removed to leave a trench. An isolation spacer is formed to contact the gate conductor of the second VFET in a first portion of the trench. A lower S/D contact of the second VFET is formed on the lower S/D element of the second VFET in a second portion of the trench, a lower S/D contact of the first VFET is formed to a lower S/D element of the first VFET, and contacts are formed.

14 Claims, 20 Drawing Sheets

FORMING CONTACTS FOR VFETS

BACKGROUND

Field of the Invention

The present disclosure relates to transistors, and more specifically, to vertical field effect transistors (VFETs) and contacts formed therein.

Description of Related Art

Transistorized devices continue to enjoy size reductions because of technological advances. For example, gate all around (GAA) device structures are replacing fin-type field effect transistors (FINFET) in order to achieve continued scaling, which may otherwise be limited by poor electrostatics in FINFET devices. As a result, new constructs are being presented to allow continued scaling with GAA structures, such as vertical field effect transistors (VFETs).

However, because VFETs are so small, it can be difficult to accurately align conductive contacts to the various components of VFETs. For example, VFETs include a lower source/drain, over which is formed a channel region and an upper source/drain, which makes is very difficult to form a contact to the lower source/drain, and to the gate that surrounds the channel region. As transistor size is continually reduced, shorts between the contacts are common.

SUMMARY

Methods herein form a first vertical field effect transistor (VFET) and a second VFET on a substrate. The first VFET and the second VFET are parallel and adjacent to one another, and the first VFET and the second VFET are each formed to include: a fin-shaped semiconductor extending from the substrate; a lower source/drain (S/D) element in the substrate contacting a first (bottom) surface of the fin-shaped semiconductor that is adjacent the substrate; a spacer layer on the lower S/D element; an upper S/D element contacting an opposite surface (top) of the fin-shaped semiconductor that is distal to the substrate; and a gate conductor laterally adjacent the fin-shaped semiconductor.

Such methods form upper spacers on upper portions of sidewalls of the fin-shaped semiconductor. Such upper portions of sidewalls of the fin-shaped semiconductor are distal to the location where the semiconductor fin contacts the lower S/D element. The upper spacers are elongated, straight, and extend away from the substrate (in a height direction) above the top of the fin-shaped semiconductor (that is distal to the lower S/D element). The upper S/D element is on the top of the fin-shaped semiconductor between the upper spacers. These methods also form a sacrificial material on the upper S/D element and between the upper spacers.

Additionally, methods herein form a cap insulator on the gate conductor of the first VFET and the second VFET. After forming the cap insulator, these methods remove portions of the cap and a gate conductor of the second VFET that is positioned over a lower S/D element of the second VFET to leave a trench. This allows these methods to form a vertical insulator to contact the gate conductor of the second VFET in a first portion of the trench. The vertical insulator and the isolation spacer are different materials. For example, the vertical insulator can be silicon dioxide ($SiO_2$) or silicon nitride (SiN), while the isolation spacer can be silicon carbide (SiC) or silicon-oxycarbide (SiCO). The vertical insulator prevents short circuits between the gate conductor of the first VFET and the lower S/D contact of the second VFET. The isolation spacer also contacts the spacer layer.

The sacrificial material is removed, and such methods form a lower S/D contact of the second VFET on the lower S/D element of the second VFET in a second portion of the trench. Also, such methods form a lower S/D contact of the first VFET to a lower S/D element of the first VFET, and form contacts to the upper S/D element and the gate conductor of the first VFET and the second VFET. The contacts to the gate conductor of the first VFET and the second VFET are formed through the cap insulator.

In other variations, methods herein recess the gate conductor to expose the top portion of the upper spacers that are distal to the substrate. The top portion of the upper spacers are removed to expose sidewalls of the sacrificial material, and methods herein form a conformal insulating material on the upper spacers and the sidewalls of the sacrificial material so that the conformal insulating material contains two right angles in cross-section where the conformal insulating material transitions from contacting the upper spacers to contacting the sacrificial material. These method form outer spacers on an upper portion of the conformal insulating material that is distal to the substrate from where the two right angles are located. The outer spacers and a lower portion of the conformal insulating material (that contacts sidewalls of the upper spacers) form a straight line.

Such methods produce various integrated circuit structures that include, among other components, a first vertical field effect transistor (VFET) and a second VFET on a substrate. The first VFET and the second VFET are parallel and adjacent to one another, and the first VFET and the second VFET each include: a fin-shaped semiconductor extending from the substrate; a lower source/drain (S/D) element in the substrate contacting a first surface of the fin-shaped semiconductor that is adjacent the substrate; an upper S/D element contacting an opposite surface of the fin-shaped semiconductor that is distal to the substrate; a gate conductor laterally adjacent the fin-shaped semiconductor; a gate contact connected to and the gate conductor; an upper S/D contact connected to the upper S/D element; a lower S/D contact connected to the lower S/D element; and upper spacers on upper portions of sidewalls of the fin-shaped semiconductor.

The upper portions of sidewalls of the fin-shaped semiconductor are distal to the location where the semiconductor fin contacts the lower S/D element. The upper spacers are elongated, straight, and extend away from the substrate in a height direction above the top of the fin-shaped semiconductor that is distal to the lower S/D element, and the upper S/D element is on the top of the fin-shaped semiconductor between the upper spacers. The first VFET and the second VFET each further include a spacer layer on the lower S/D element, where the isolation spacer contacts the spacer layer.

The first VFET and the second VFET each further include a cap insulator on the gate conductor, where the gate contacts are formed through the cap insulator. The vertical insulator and the isolation spacer are different materials. For example, the vertical insulator can be silicon dioxide ($SiO_2$) or silicon nitride (SiN), while the isolation spacer can be silicon carbide (SiC) or silicon-oxycarbide (SiCO). The vertical insulator prevents short circuits between the gate conductor of the first VFET and the lower S/D contact of the second VFET.

Further, the vertical insulator contacts, and is laterally adjacent to, the gate conductor of the second VFET, and extends from the lower spacer of the second VFET in a vertical direction that is generally perpendicular to the plane of the lower spacer. Also, the lower S/D contact of the second VFET contacts, and is laterally adjacent to (parallel to), the vertical insulator and extends through the lower spacer to the lower S/D element of the second VFET. The isolation spacer contacts, and is laterally adjacent to (parallel to), the lower S/D contact of the second VFET and extends from the lower spacer of the second VFET.

Alternative structures further include a conformal insulating material on the upper spacers and the sidewalls of the upper S/D contact. The conformal insulating material contains two right angles in cross-section where the conformal insulating material transitions from contacting the upper spacers to contacting the upper S/D contact. These structures also include a vertical insulator contacting a gate conductor of the second VFET and a lower S/D contact of the second VFET. The first VFET and the second VFET each further include outer spacers on an upper portion of the conformal insulating material that is distal to the substrate from where the two right angles are located, and the outer spacers and a lower portion of the conformal insulating material that contacts sidewalls of the upper spacers form a straight line.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, VFETs include a lower source/drain, over which is formed a channel region and an upper source/drain, which makes is very difficult to form a contact to the lower source/drain, and to the gate that surrounds the channel region. As transistor size is continually reduced, shorts between the contacts are common. The systems and methods herein address these issues by forming a trench between transistors, followed by formation of an isolation spacer that is different from other dielectrics formed.

Figure 1A:
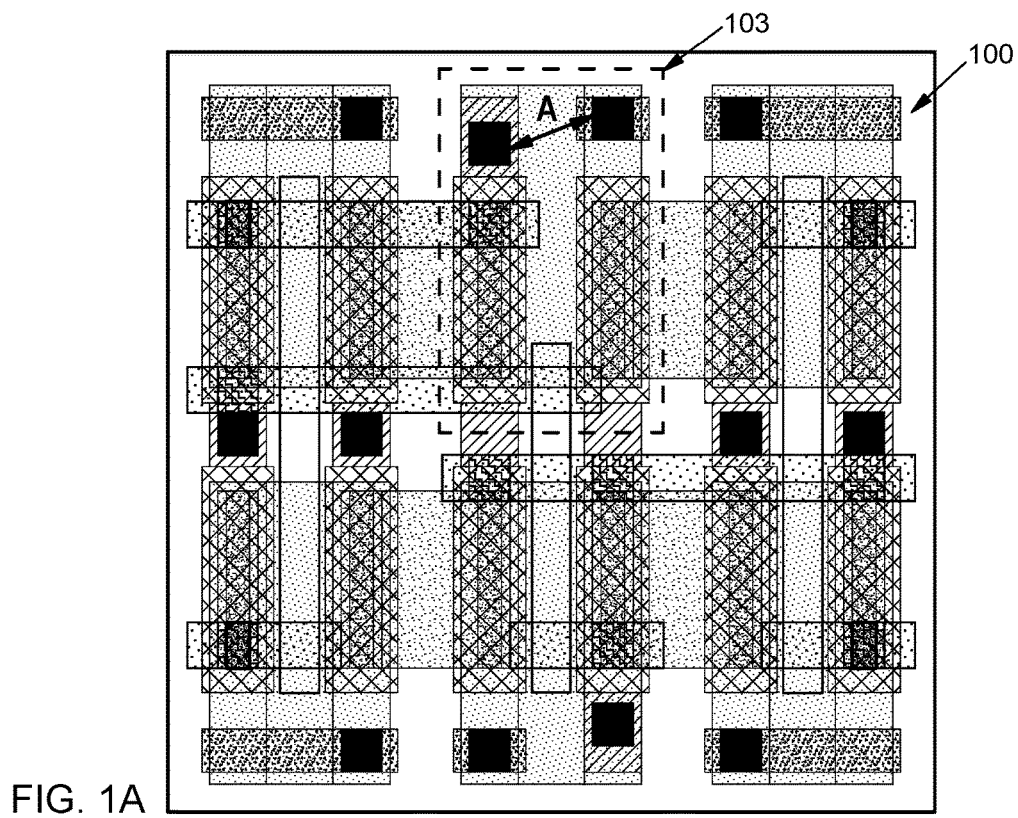
FIGS. 1A-1B are schematic diagrams illustrating a top-down (plan) view of transistors formed on a substrate according to embodiments herein.
Figure 1B:
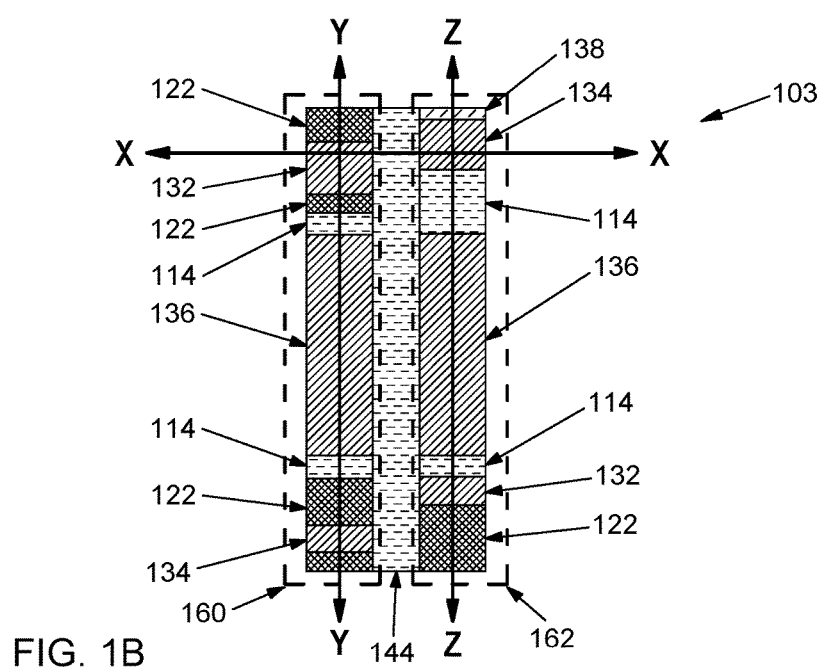
Figure 14A:
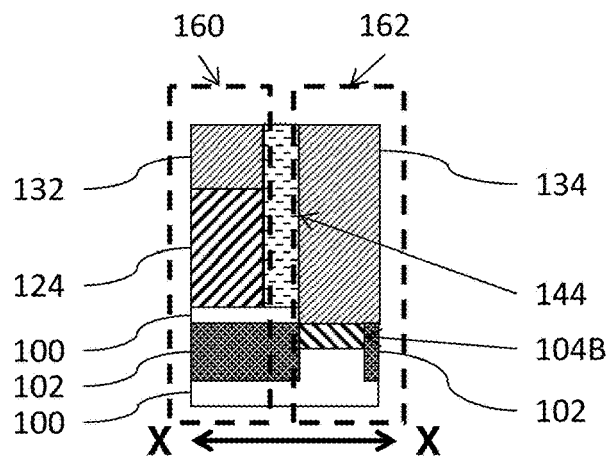
Figure 14B:
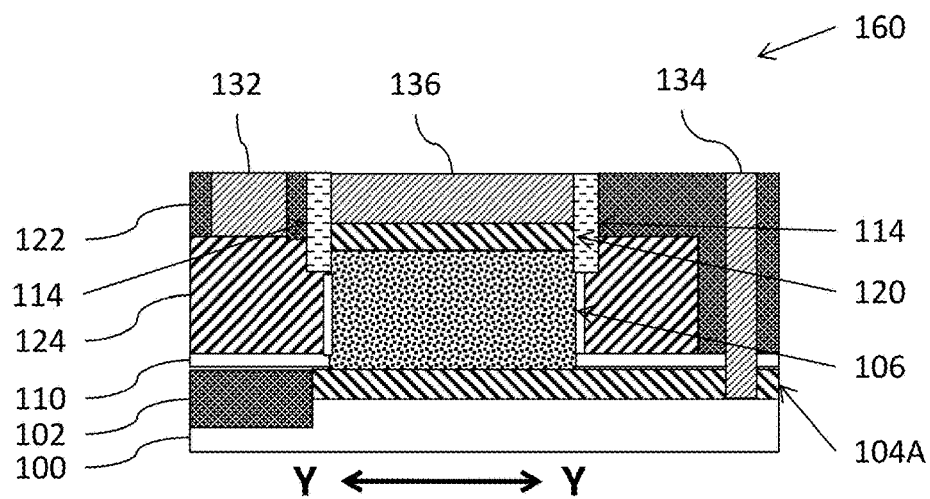
Figure 14C:
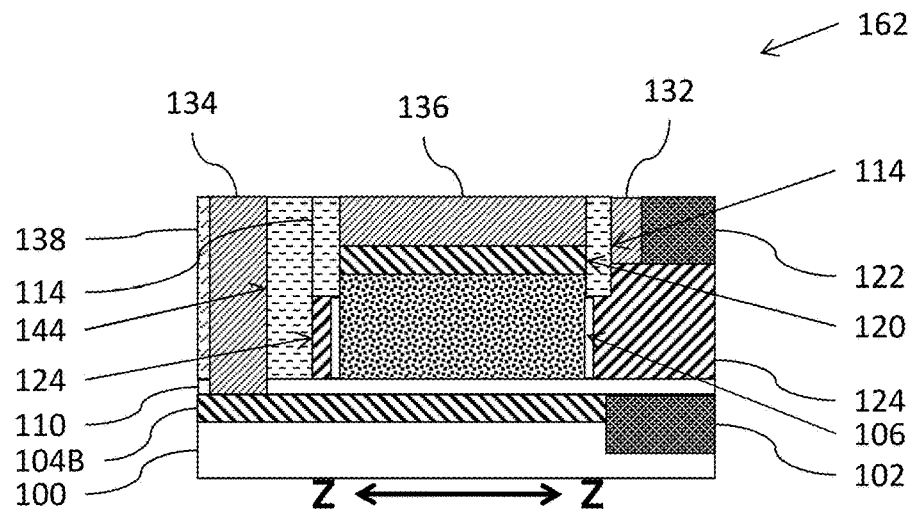
Figure 15:
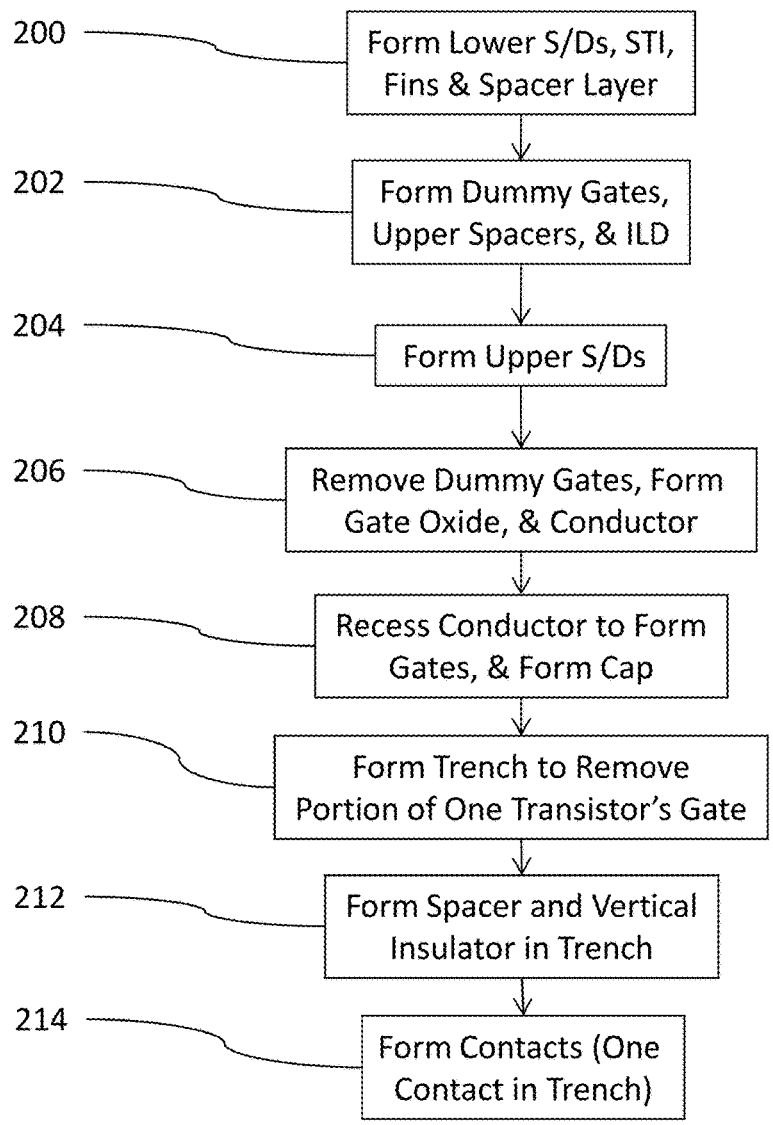
FIG. 15 is a flow diagram illustrating embodiments herein.
Figure 16A:
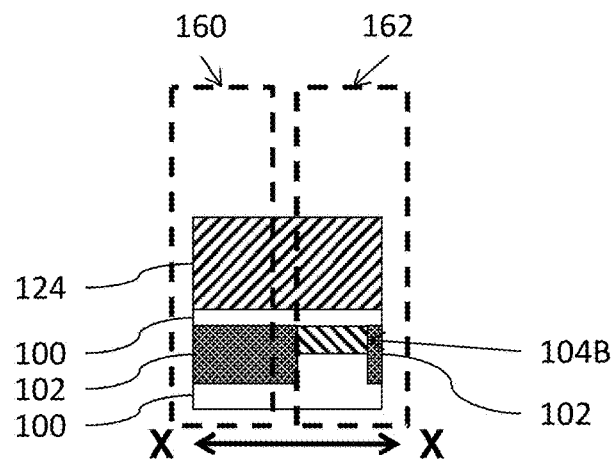
FIGS. 16A-19C are schematic diagrams illustrating cross-sectional views of transistors shown in FIG. 1B according to embodiments herein.
Figure 16B:
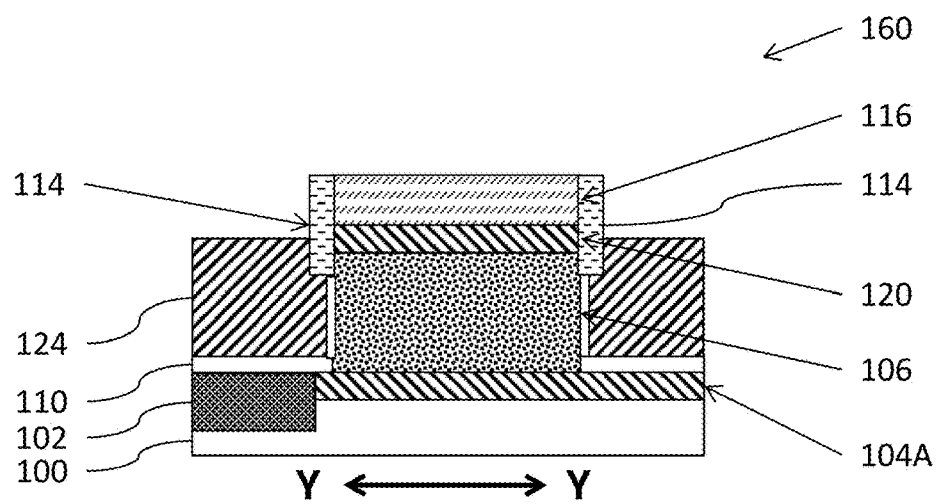
Figure 16C:
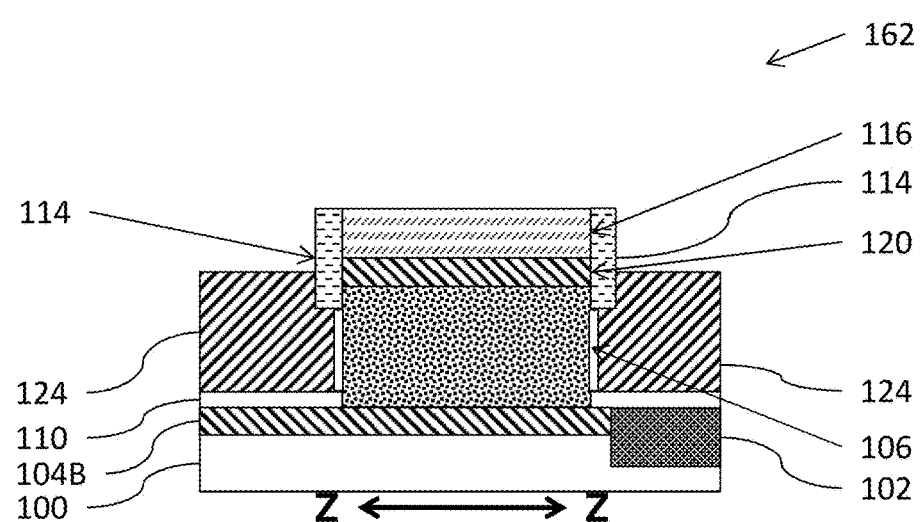
Figure 17A:
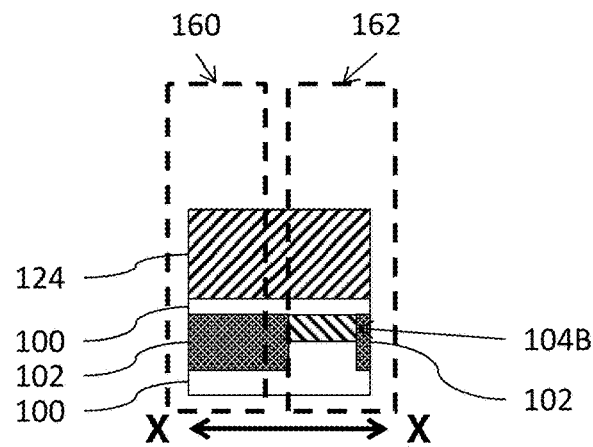
Figure 17B:
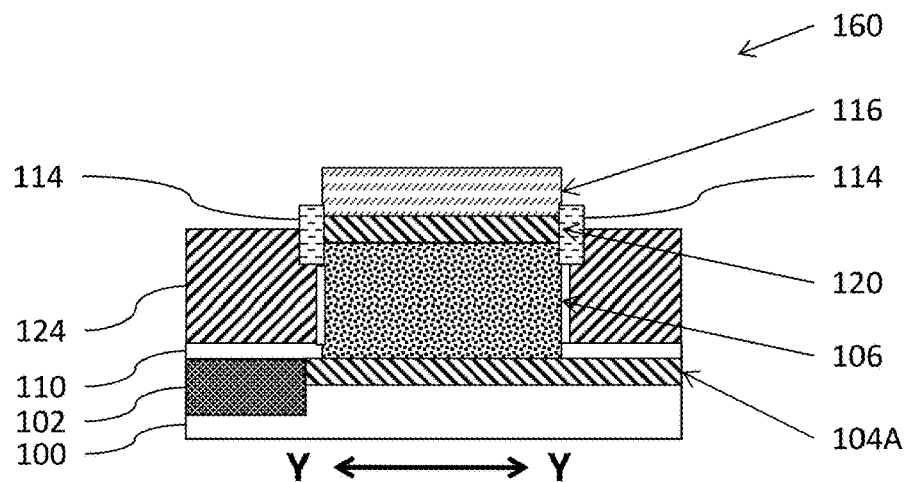
Figure 17C:
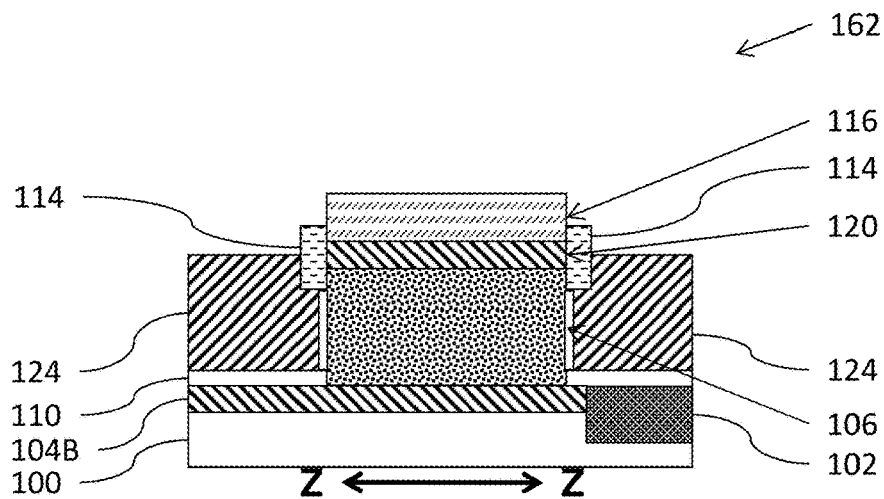
Figure 18A:
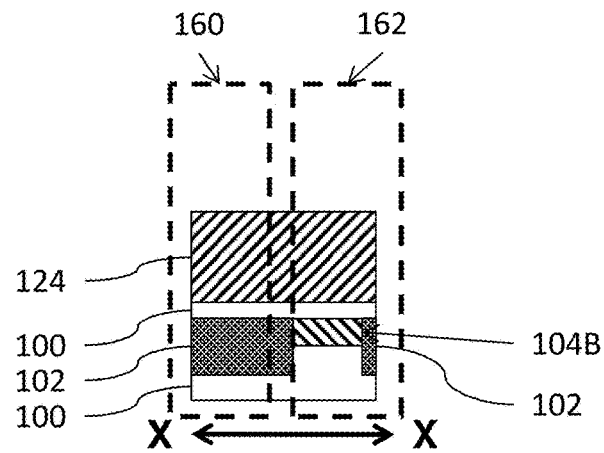
Figure 18B:
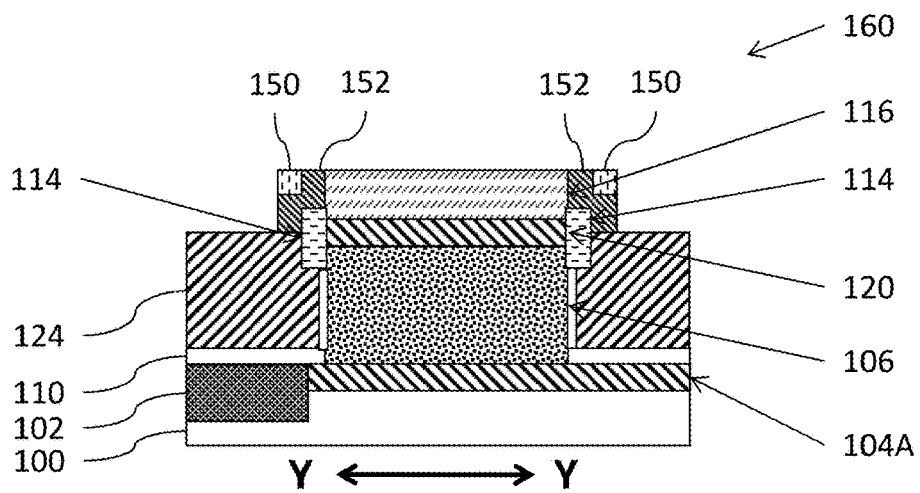
Figure 18C:
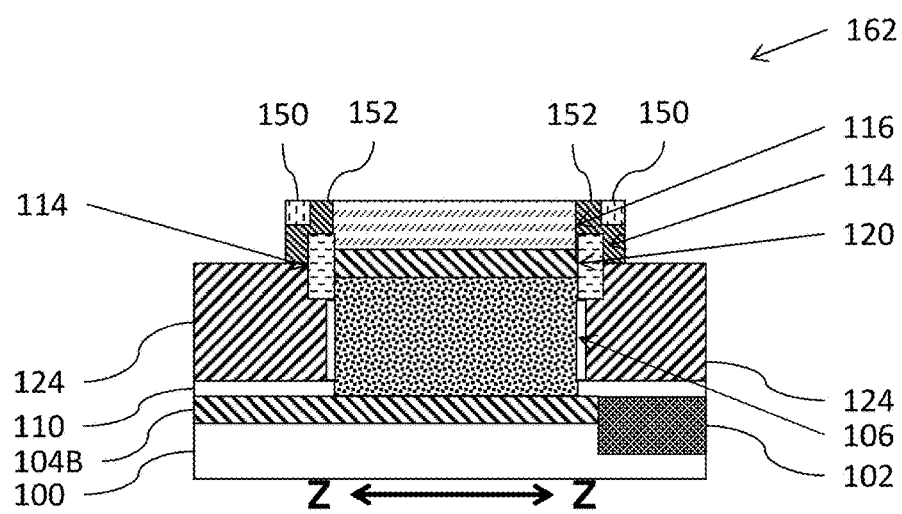

As shown in FIGS. 1A-1B, methods herein form a first vertical field effect transistor (VFET) 160 and a second VFET 162 on a substrate 100. More specifically, FIG. 1A illustrates a top-down (plan) view of many transistors formed on a substrate 100, and one region 103 of the integrated circuit structure shown in FIG. 1A is shown in isolation in FIG. 1B. As shown in FIG. 1B, the first VFET 160 and the second VFET 162 are parallel and adjacent to one another. FIG. 1B illustrates various cross-sectional lines X-X, Y-Y, Z-Z, and the "A" drawings of FIGS. 2A-14C and 16A-19C are cross-sectional views along line X-X in FIG. 1B; the "B" drawings of FIGS. 2A-14C and 16A-19C are cross-sectional views along line Y-Y in FIG. 1B; and the "C" drawings of FIGS. 2A-14C and 16A-19C are cross-sectional views along line Z-Z in FIG. 1B. Additionally, FIGS. 15 and 20 show such processing in flowchart form.

While the structure will be described in greater detail below, in the top view shown in FIG. 1B, it can be seen that the first VFET 160 and the second VFET 162 each include upper spacers 114, a cap insulator 122, gate contacts 132, lower S/D contacts 134, upper S/D contacts 136, an isolation spacer 138, and a vertical insulator 144. The method of formation, locations, connections, and operation of such elements is discussed below.

Therefore, FIGS. 2A-14C and 16A-19C are cross-sectional views showing various stages of manufacture of the VFETs 160, 162. FIG. 15 is described simultaneously with FIGS. 2A-14C, where item 200 in FIG. 15 begins by forming (see FIGS. 2A-2C): shallow trench isolation (STI) structures 102 in the substrate 100; a lower source/drain (S/D) element 104A-B in the substrate 100; a fin-shaped semiconductor 106 extending from the substrate 100 (the lower S/D 104A-B contacts a first (bottom) surface of the fin-shaped semiconductor 106); and a spacer layer 110 on the lower S/D element 104A-B. The lower S/D element 104A-B is formed between the shallow trench isolation regions 102 in the substrate 100, and the lower S/D element 104A of the first partially formed VFET 160 is distinguished from the lower S/D element 104B of the second partially formed VFET in the drawings.

The shallow trench isolation structures 102 are generally formed by patterning openings/trenches within the substrate and growing or filling the openings with a highly insulating material (this allows different active areas of the substrate to be electrically isolated from one another).

Figure 2A:
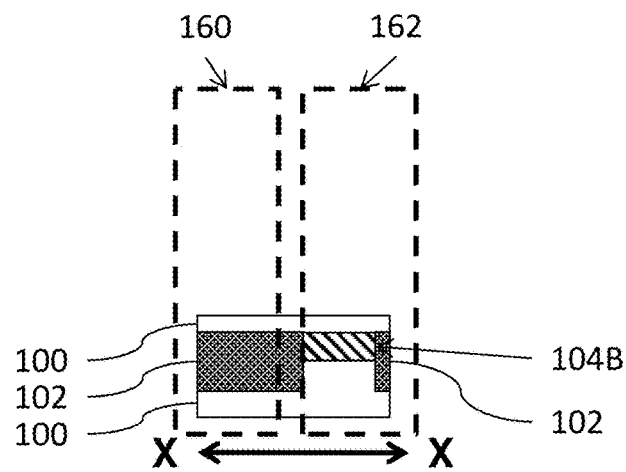
FIGS. 2A-14C are schematic diagrams illustrating cross-sectional views of transistors shown in FIG. 1B according to embodiments herein.
Figure 2B:
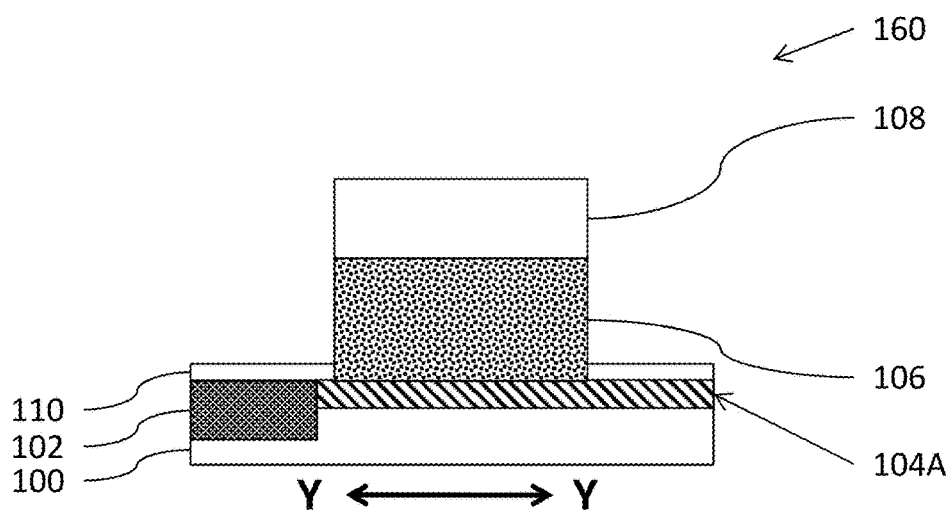
Figure 2C:
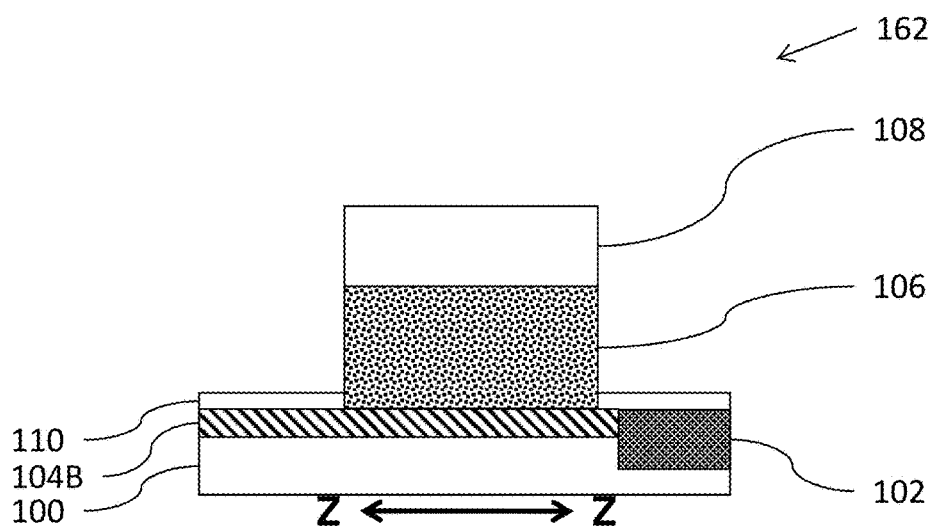
Figure 3A:
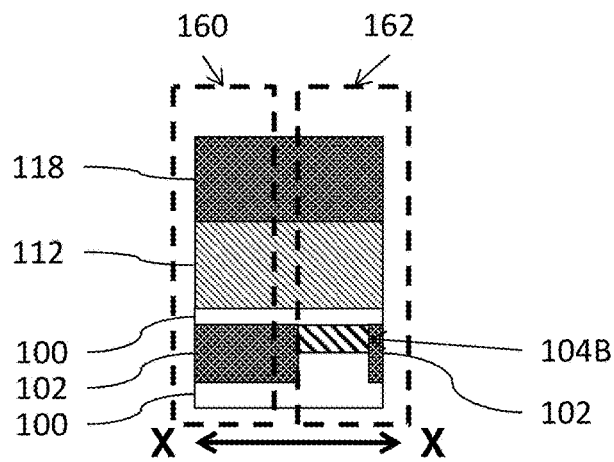
Figure 3B:
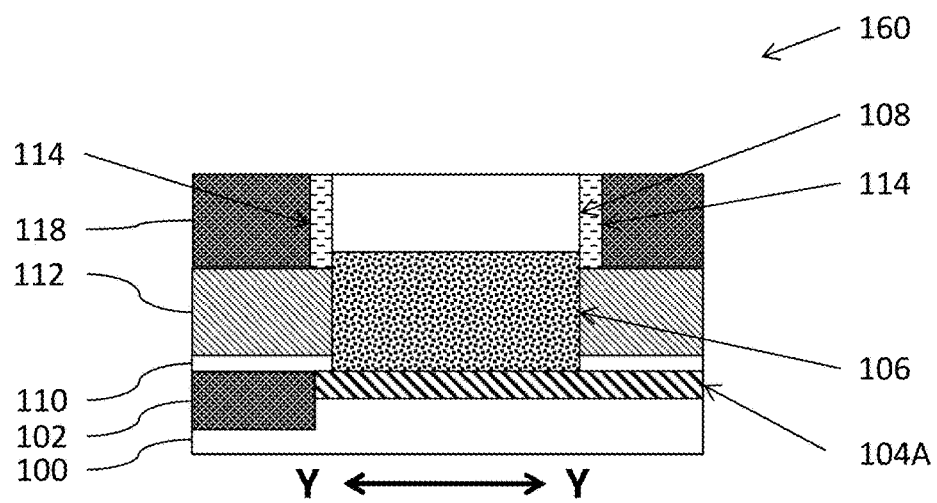
Figure 3C:
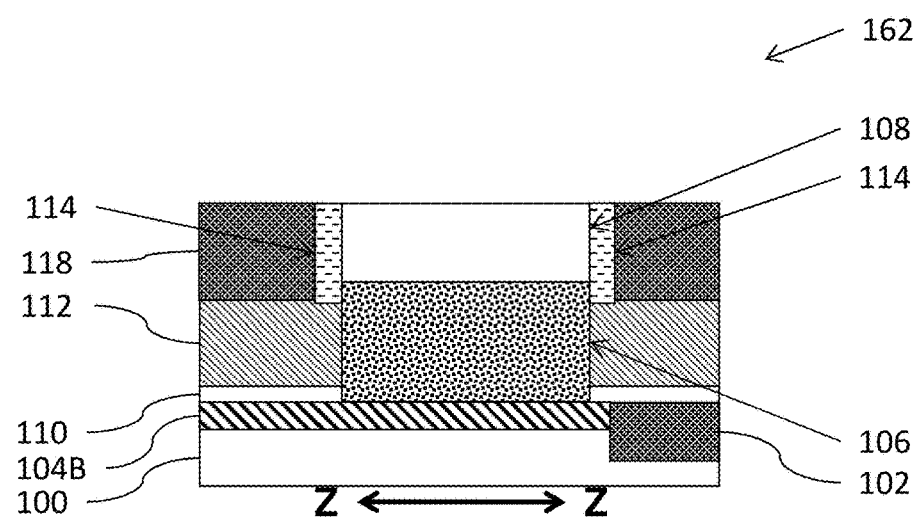
Figure 4A:
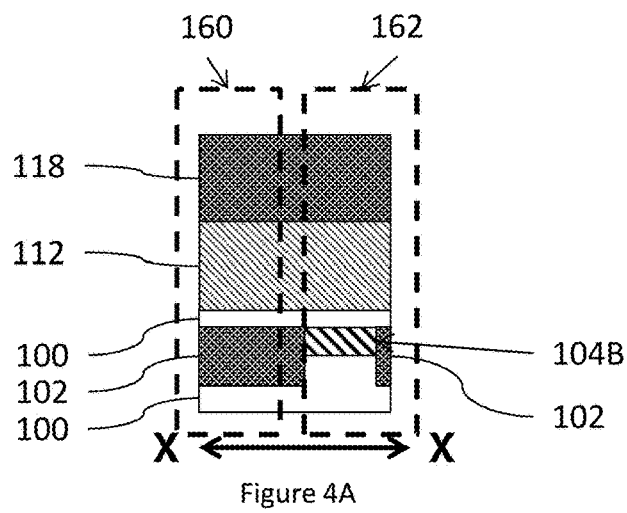
Figure 4B:
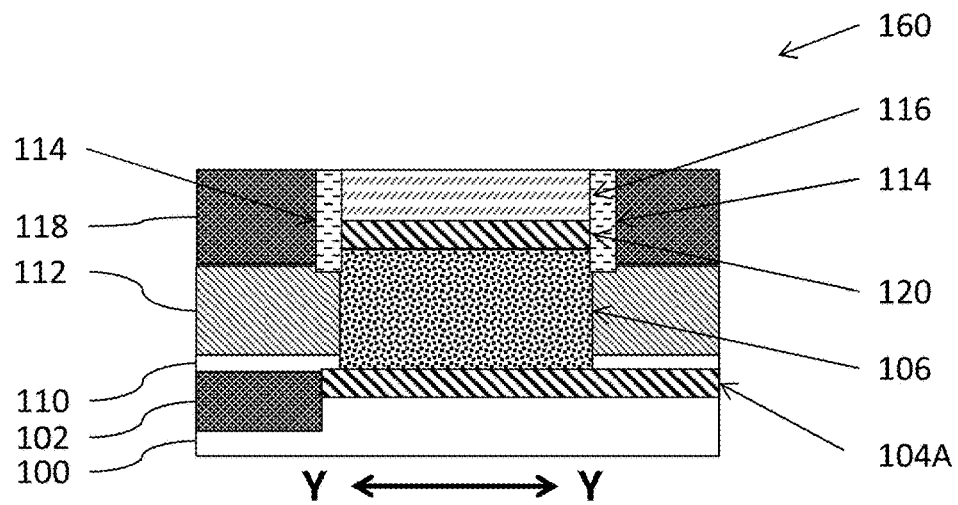
Figure 4C:
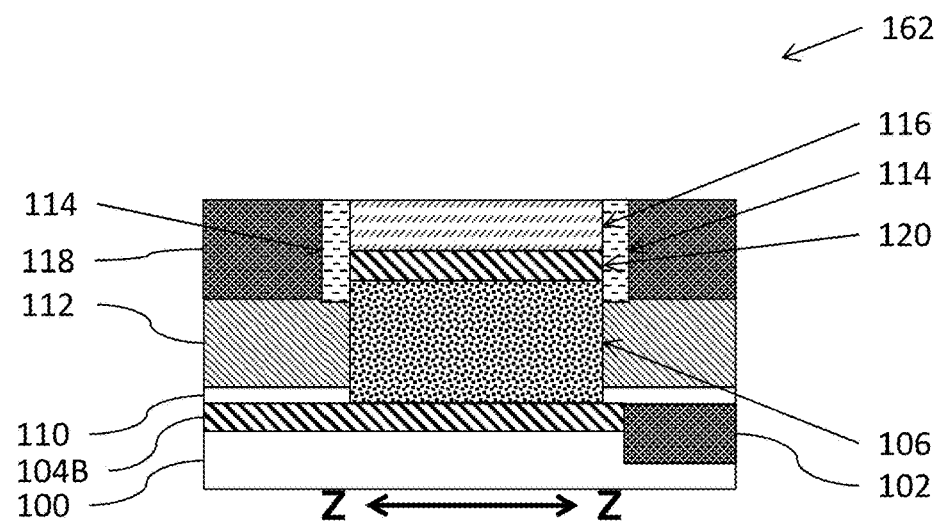
Figure 5A:
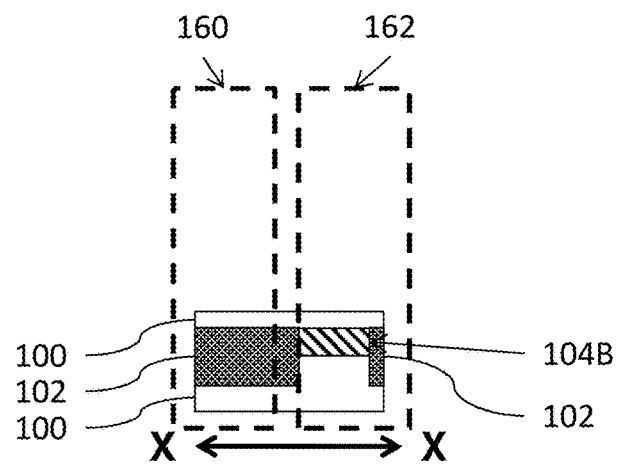
Figure 5B:
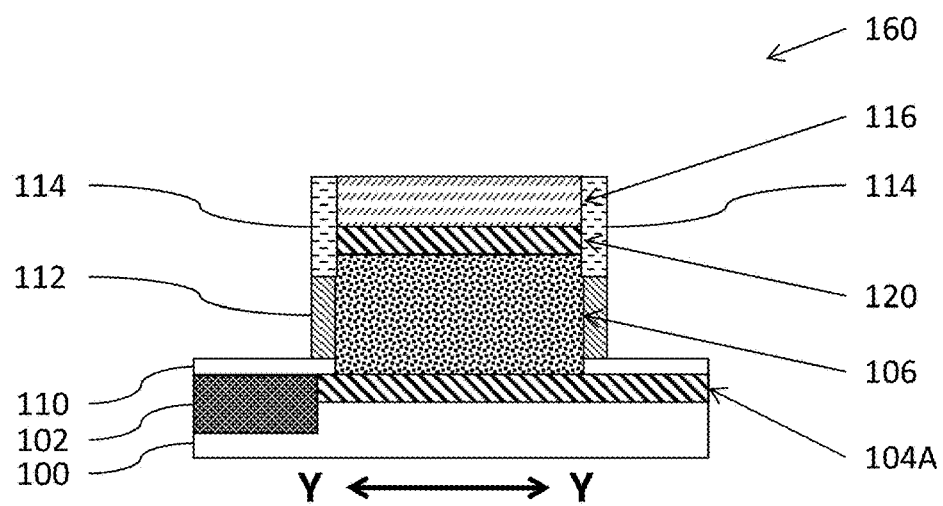
Figure 5C:
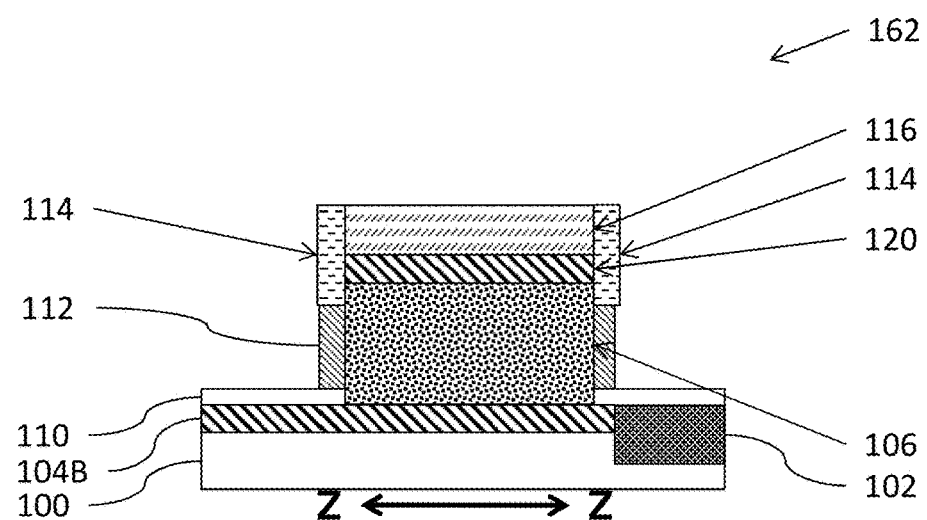

In FIGS. 2A-2C, the lower S/D element 104A-B is highly conductive and is formed by implanting impurities into the substrate 100 in a pattern between the STI regions 102 to form the conductors in the substrate 100 (alternatively, the STI regions 102 could be formed after the lower S/D element 104A-B is formed). Note that, as shown in FIGS. 2B and 2C, the STI regions 102 are not symmetrical, and the lower S/D elements are bordered by a single STI 102; and, therefore, the lower S/D element 104A-B are also asymmetrical and have one end that extends further from the fin-shaped semiconductor 106 relative to the other end. As will be explained in greater detail below, the asymmetrical shape of the lower S/D elements 104A-B allows easier formation of the lower S/D contact 134 (FIG. 14A).

In FIGS. 2A-2C and item 200, the fin-shaped semiconductor 106 is generally formed by depositing or epitaxially growing a layer of semiconductor material, and patterning the semiconductor layer into fins. Additionally, item 108 is the mask used to pattern the fin-shaped semiconductor 106. The spacer layer 110 is generally formed by directional dielectric deposition, such as HDP deposition process or gas cluster ion beam (GCIB) deposition process.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor. Generally, transistor structures are formed by depositing or implanting impurities into a substrate to form at least one semiconductor channel region, bordered by shallow trench isolation regions below the top (upper) surface of the substrate.

A "substrate" herein can comprise any material appropriate for the given purpose (whether now known or developed in the future) and can comprise, for example, silicon-based wafers (bulk materials), ceramic materials, organic materials, oxide materials, nitride materials, etc., whether doped or undoped. For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

As shown in item 202 in FIG. 15, and FIGS. 3A-3C, another sacrificial material 112 (dummy gate, i.e.,) is formed as a thin layer of SiO$_2$ followed by a-Si deposition. Therefore, sacrificial material 112 can be, for example, SiO$_2$, a-Si, or a combination of SiO$_2$ and a-Si. Next, upper spacers 114 are formed on upper portion of sidewall of the fin-shaped semiconductor 106 and on sidewall of the mask 108, where the dummy gates 112 restrict the location of the upper spacers 114 to the upper portions of the sidewalls of the fin-shaped semi conductor 106. Such upper portions of sidewalls of the fin-shaped semiconductor 106 are distal to the location where the semiconductor 106 fin contacts the lower S/D element 104A-B. The upper spacers 114 are elongated, straight, and extend away from the substrate 100 (in a height direction) above the top of the fin-shaped semiconductor 106 (that is distal to the lower S/D element 104A-B). A sacrificial layer 118 insulator is then formed over the structure, and reduced in height by processing such as chemical mechanical polishing (CMP).

In item 204 in FIG. 15, and FIGS. 4A-4C, the mask 108 is removed using a selective material removal process (e.g., reactive ion etching (RIE), etc.) that removes the mask 108 without affecting the rest of materials. Then, a conductive upper S/D element 120 is formed (deposited/grown) to contact a top surface of the fin-shaped semiconductor 106 (the top of the fin 106 is distal to the substrate 100). Therefore, this forms the upper S/D element 120 on the top of the fin-shaped semiconductor 106 between the upper spacers 114. These methods also form (deposit/grow) a sacrificial material 116 on the upper S/D element 120 and between the upper spacers 114.

Figure 6A:
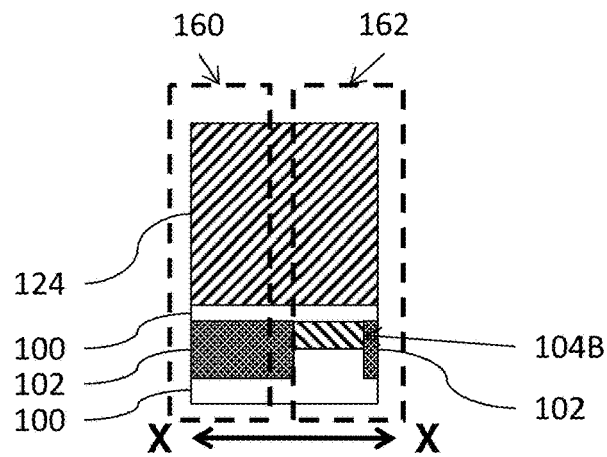
Figure 6B:
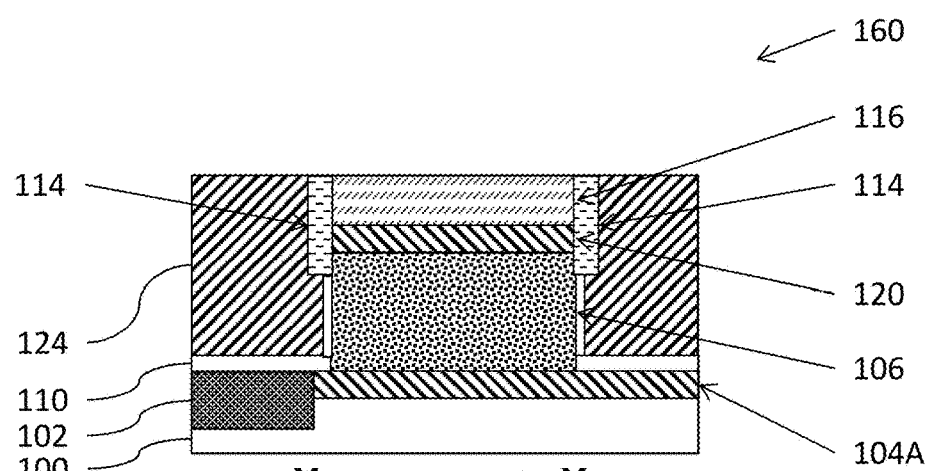
Figure 6C:
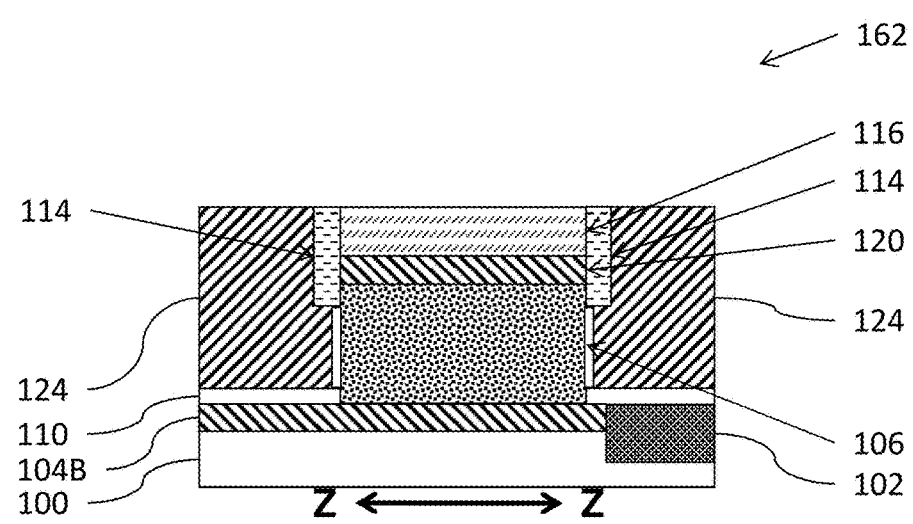

Processing in item 206 in FIG. 15, and FIGS. 5A-5C removes the sacrificial layer 118 and portions of dummy gate 112 that are not protected by the sacrificial material 116 and upper spacers 114 (using, for example reactive ion etching (RIE), etc.) to leave the spacer layer 110 exposed. Then, as shown in FIGS. 6A-6C, the remainder of the dummy gate 112 is removed in a selective removal process, and a gate oxide is formed (grown) to contact sidewalls of the fin-shaped semiconductor 106. More specifically, an atomic layer deposition (ALD) HfO$_2$ gate oxide is used, and it is formed everywhere, including on the fin sidewall, over the top spacer, bottom spacer, etc.

Figure 7A:
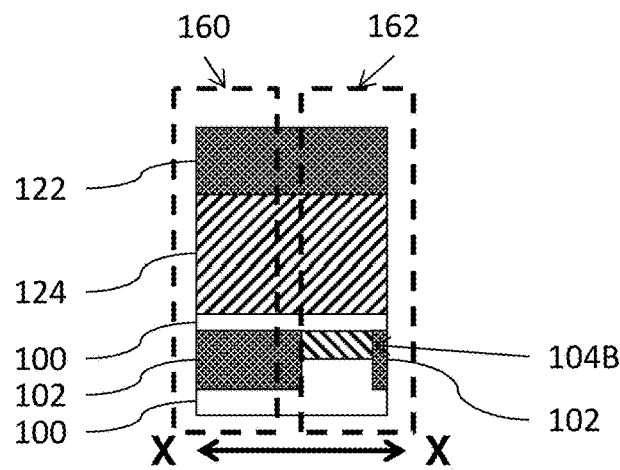
Figure 7B:
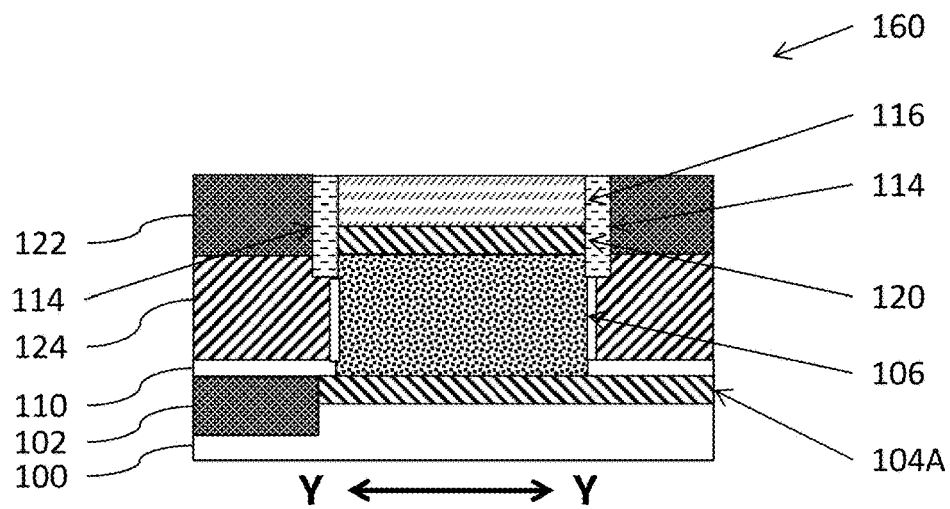
Figure 7C:
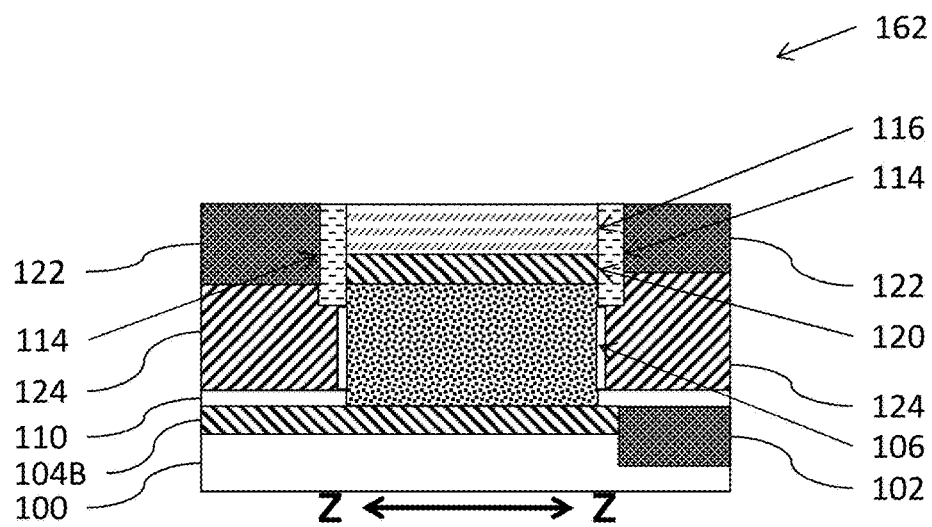

Additionally, as further shown in item 206, a gate conductor 124 (high-K metal gate (HKMG)) is deposited to contact the gate oxide and upper spacers 114 (and planarized). Conceptually, the gate stack includes (1) HfO$_2$ gate dielectric, (2) work function metals, (3) conductive metals such as W, Ru or Co, and are generally represented by numeral 124 in the accompanying drawings. Additionally, as shown in FIGS. 7A-7C and item 208, methods herein recess the gate conductor 124 and form a cap insulator 122 (e.g., grown oxide) on the recessed gate conductor 124 of the first VFET 160 and the second VFET 162.

Figure 8A:
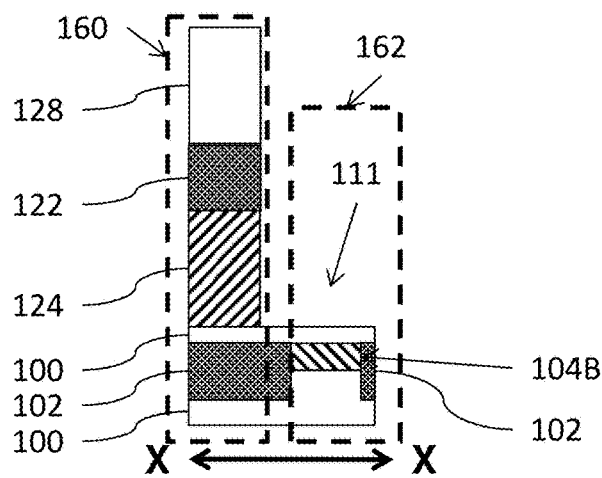
Figure 8B:
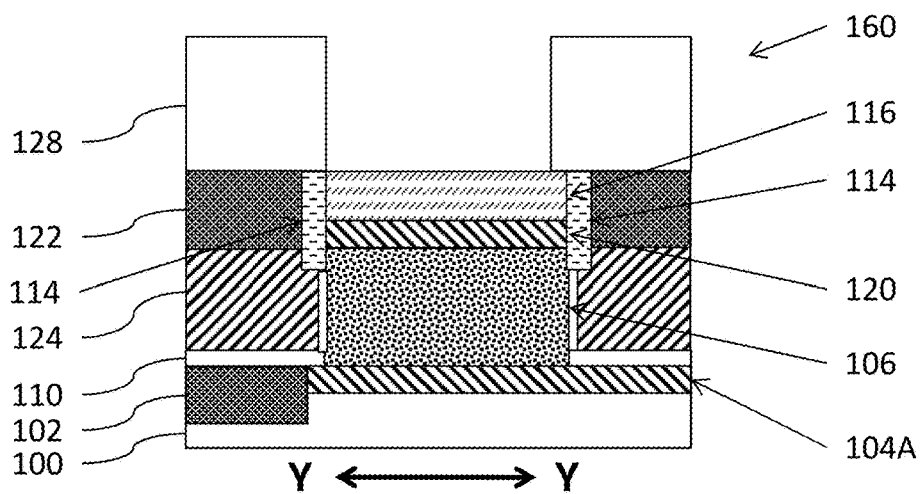
Figure 8C:
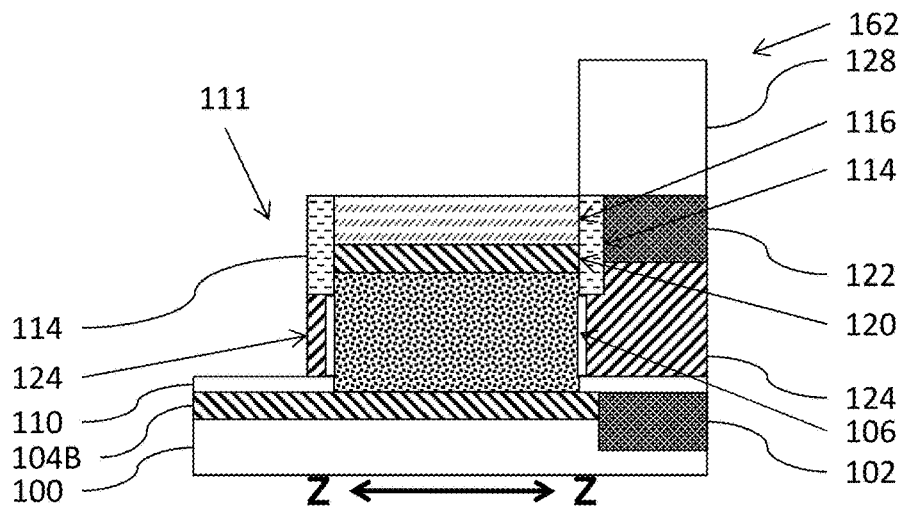
Figure 9A:
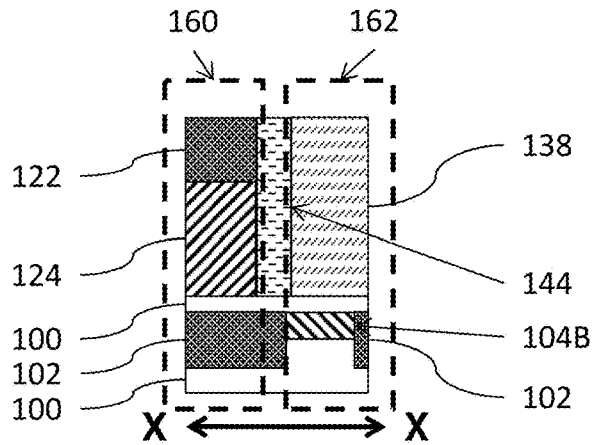
Figure 9B:
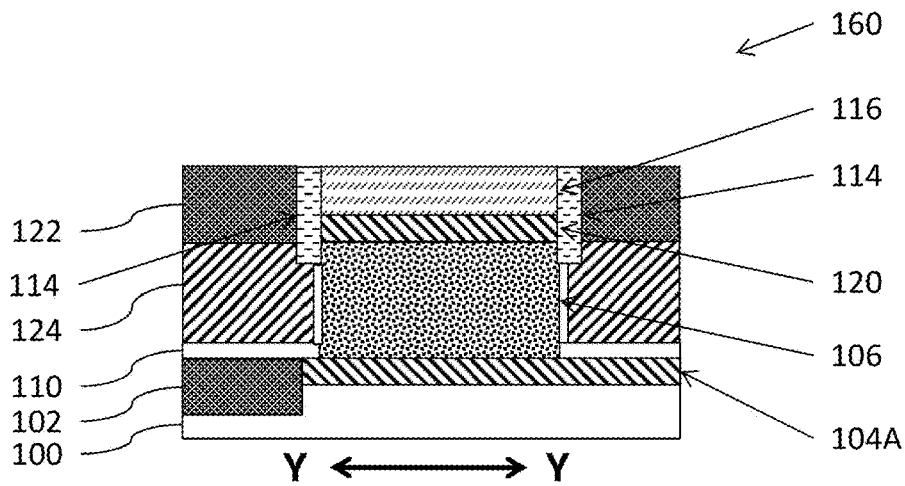
Figure 9C:
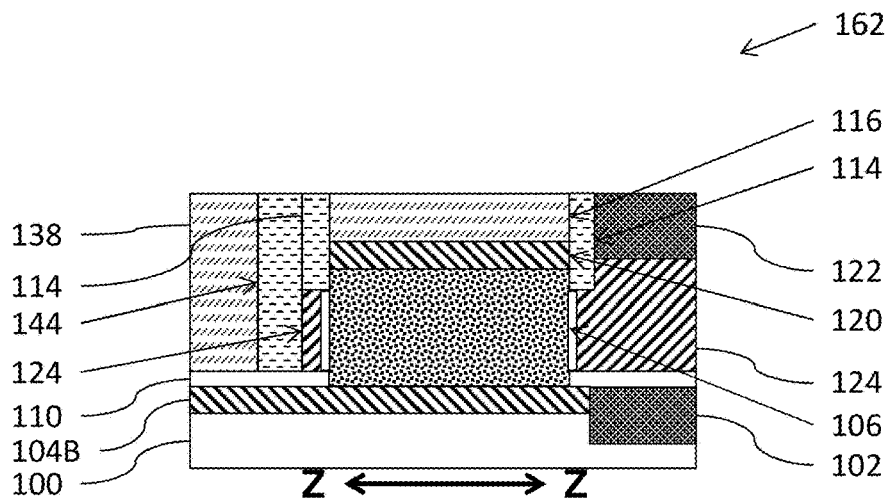

In item 210 in FIG. 15, and FIGS. 8A-8C, the methods herein pattern a gate patterning mask 128 that leaves one end of the second VFET 162 exposed, and these methods remove portions of the cap insulator 122 and the gate conductor 124 of the second VFET 162 that are positioned over a lower S/D element 104B of the second VFET 162 to leave a trench 111. Note however, the upper spacer 114 allows a portion of the gate conductor 124 to remain on the gate oxide adjacent the recess 111, as shown most clearly in FIG. 8C. The gate patterning mask 128 defines where the HKMG 124 is to remain, and where unwanted portions of HKMG 124 will be removed. In FIGS. 8A-8C, all HKMG 124 that is not covered by the upper spacer 114 or the gate patterning mask 128 will be etched away.

This allows these methods to form an isolation spacer 138 in a first portion of the trench 111 and another vertical insulator (inter-layer dielectric (ILD)) 144 (which can, but does not need to be, the same material as upper spacer 114) to contact the gate conductor 124 of the second VFET 162 in the other portion of the trench 111, as shown in item 212 in FIG. 15, and FIGS. 9A-9C. In this processing, sequential deposition/etch processes of the isolation spacer 138 and vertical insulator 144 (that are self-aligned to the vertical insulator 144), to form the two items side-by-side in the trench 111. The mask 128 (see FIG. 8B) can be removed at a convenient point in this processing. As shown, the isolation spacer 138 also contacts the spacer layer 110. The cap insulator 122 and the isolation spacer 138 are different materials. For example, the cap insulator 122 and other vertical insulator 144 can be silicon dioxide (SiO$_2$) or silicon nitride (SiN), while the isolation spacer 138 includes silicon carbide (SiC) or silicon-oxycarbide (SiCO). The vertical insulator 144 prevents short circuits between the gate conductor contact 132 of the first VFET 160 and the lower S/D contact 134 (shown in FIG. 14B-14C, discussed below) of the second VFET 162.

Figure 10A:
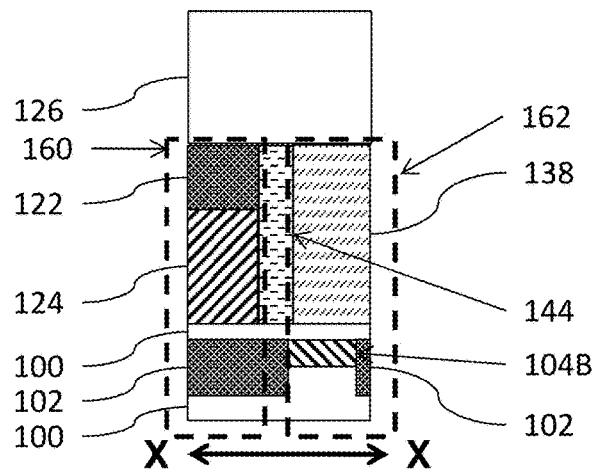
Figure 10B:
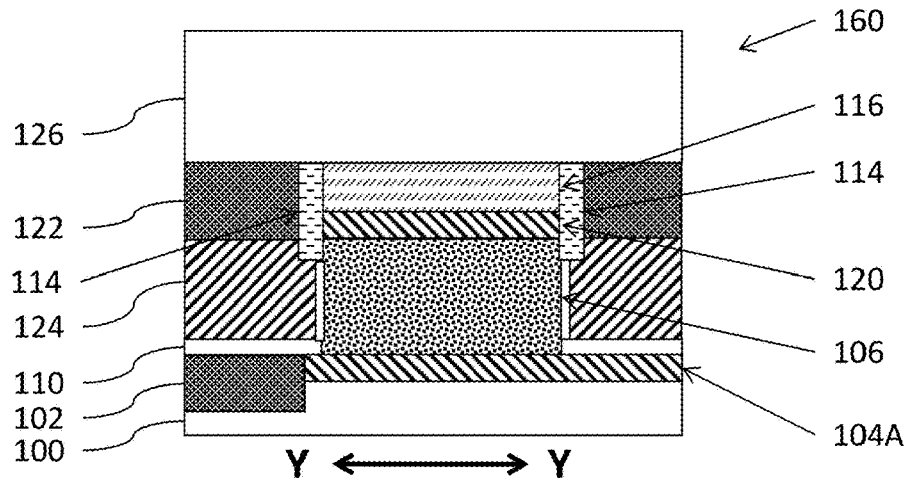
Figure 10C:
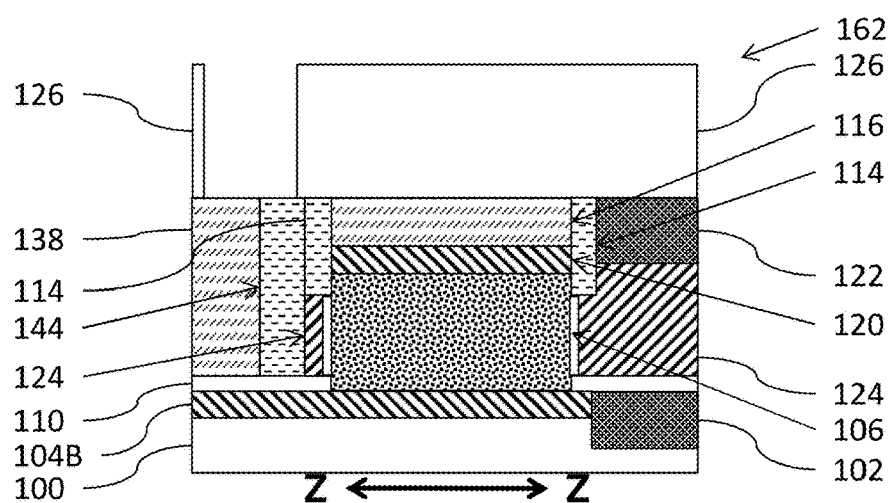
Figure 11A:
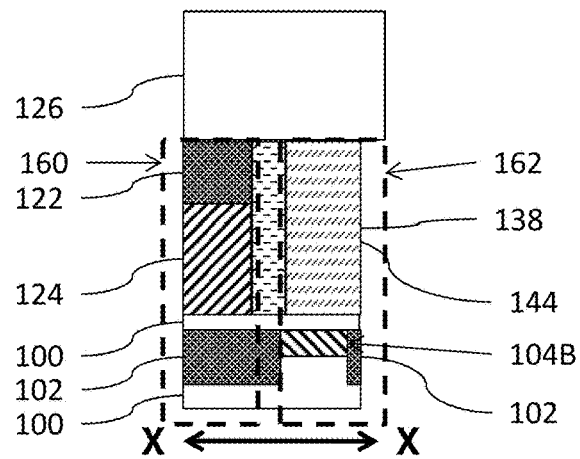
Figure 11B:
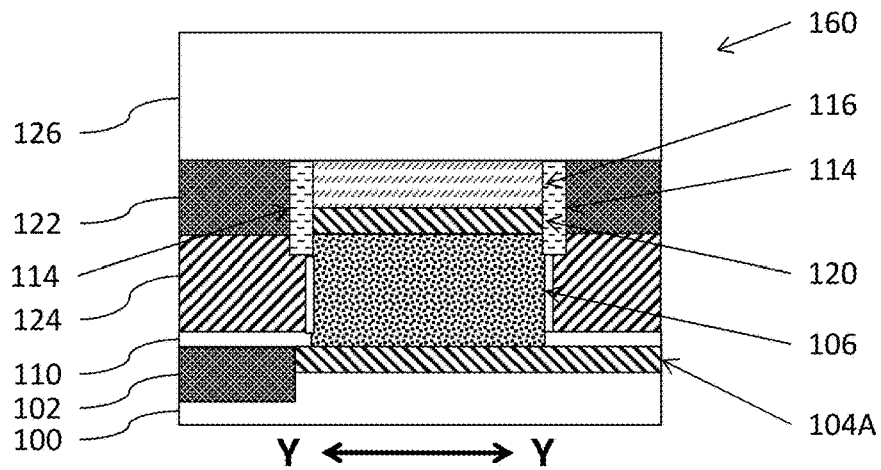
Figure 11C:
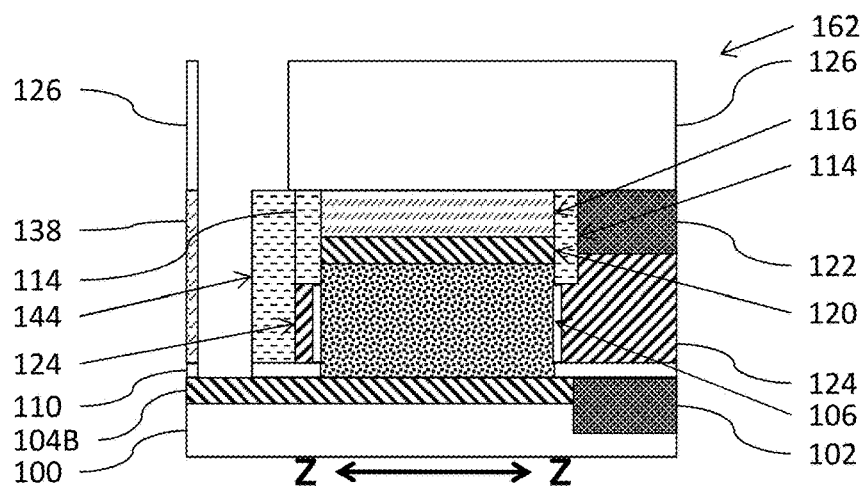
Figure 12A:
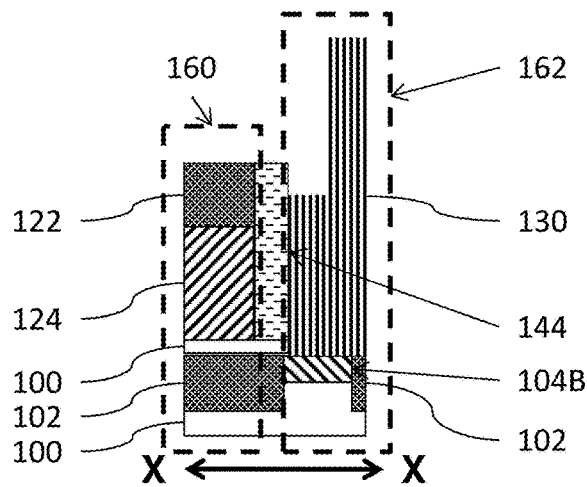
Figure 12B:
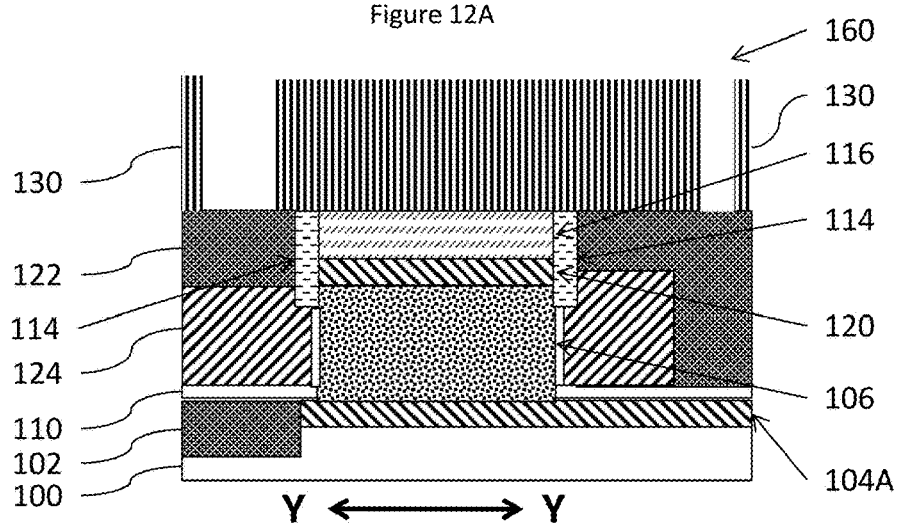
Figure 12C:
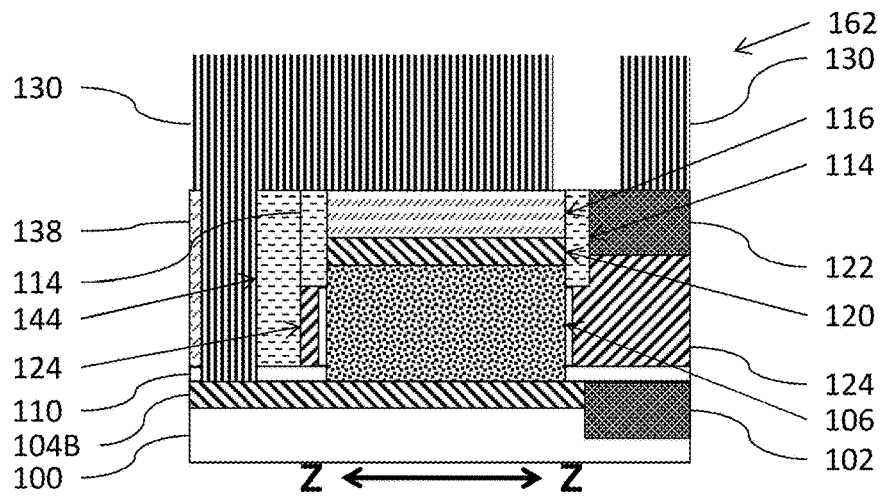
Figure 13A:
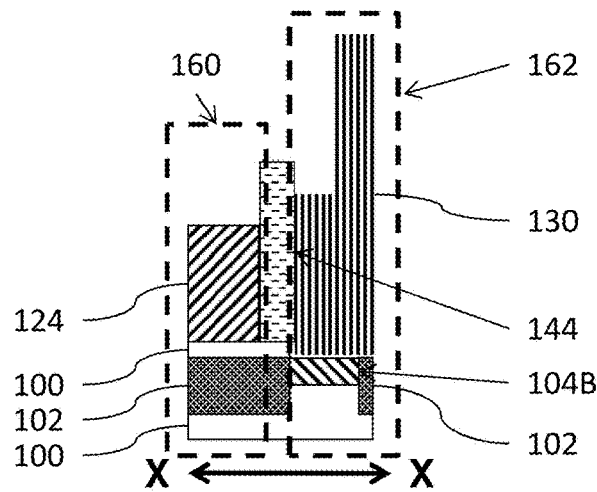
Figure 13B:
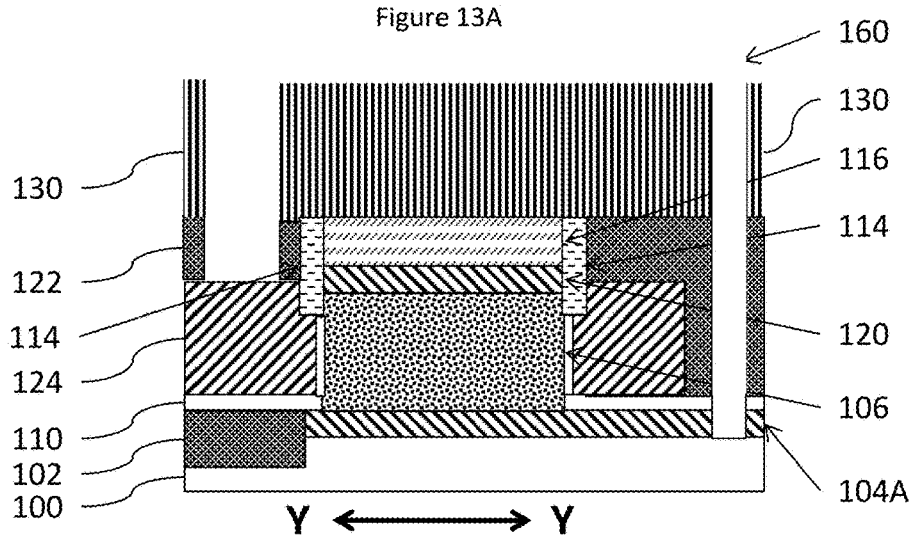
Figure 13C:
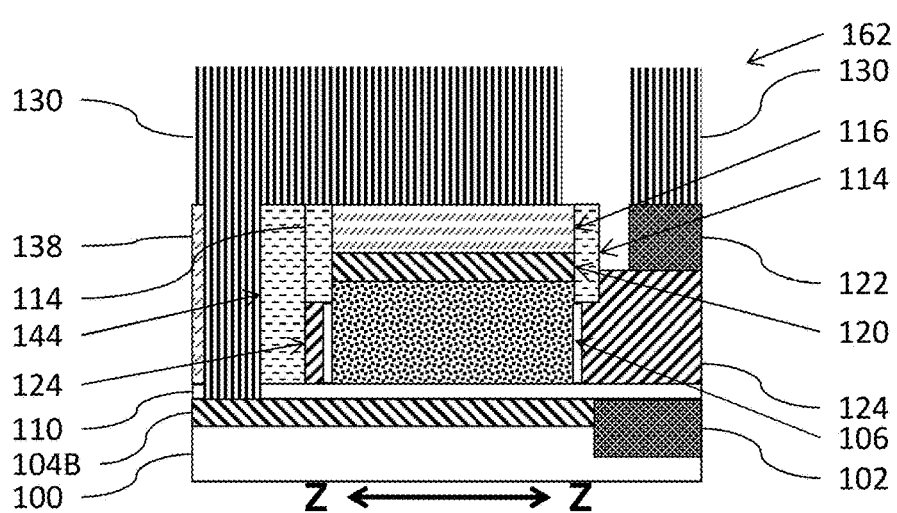

As shown in FIGS. 10A-10C, an additional mask 126 (TS litho) is patterned that exposes the isolation spacer 138 and the vertical insulator 144; and, as shown in FIGS. 11A-11C, portions of the isolation spacer 138 are removed through the mask 126. Note that a portion of the isolation spacer 138 remains. Similarly, after removing mask 126, in FIGS. 12A-12C another mask 130 (CB litho) is patterned to expose portions of the cap insulator; and in FIGS. 13A-13C a selective removal process is performed to expose portions of the gate conductor 124. In FIGS. 14A-14C, after removing mask 130 and the sacrificial material 116, the openings formed by masks 126 and 130 are filled with a conductor to form gate contacts 132, lower S/D contacts 134, and upper S/D contacts 136. Note that the views in FIGS. 12B, 13B, and 14B have been expanded, relative to the other drawings, to illustrate the mask and contacts more fully. In particular FIG. 12B has been expanded to show, previously not shown in FIG. 11B, that a portion of cap insulator 122 is formed to the sidewall of gate conductor 124. Therefore, such methods form a lower S/D contact 134 on the lower S/D element 104B of the second VFET in a second portion of the trench 111 in item 214 in FIG. 15. The contacts 132 to the gate conductor 124 of the first VFET 160 and the second VFET 162 are formed through the cap insulator 122 in item 214 in FIG. 15.

As can be seen in FIGS. 1A-1B and 14A-14C, the isolation spacer 138 and the vertical insulator 144 provide a greater form of electrical insulation within the area identified by letter A in FIG. 1A, between the gate contact 132 and the lower S/D contact 134, and this prevents short circuits between the gate conductor contact 132 of the first VFET 160 and the lower S/D contact 134 of the second VFET 162. More specifically, using materials such as silicon dioxide ($SiO_2$) or silicon nitride (SiN) for the vertical insulator 144, while using materials such as silicon carbide (SiC) or silicon-oxycarbide (SiCO) for the isolation spacer 138 provides a very stout insulator that eliminates short circuits. Additionally, the asymmetric length of the lower S/D 104B allows the contacts 132, 134 to be offset and not be directly laterally adjacent one another; and this additional spacing further reduces the incident of contact-to-contact electrical shorts.

In other variations, shown in FIGS. 16A-20 (that are discussed simultaneously), this discussion begins with the structure shown in FIGS. 6A-6C, and item 206 in the flowchart in FIG. 20. The processing in items 200-206 is as discussed above and are illustrated in FIGS. 1A-5C, and a redundant discussion of the same is omitted for brevity. Then, as shown in item 207A in FIG. 20, and FIGS. 16A-16C, this processing recesses the gate conductor 124 to expose the top portion of the upper spacers 114 that are distal to the substrate 100. Next, as shown in item 207B in FIG. 20, and FIGS. 17A-17C, the top portions of the upper spacers 114 are removed, to expose sidewalls of the sacrificial material 116.

As shown in item 207C in FIG. 20, and FIGS. 18A-18C, methods herein then form a conformal insulating material 152 (e.g., SiN) on the upper spacers 114 and the sidewalls of the sacrificial material 116 so that the conformal insulating material 152 contains two right angles in cross-section where the conformal insulating material 152 transitions from contacting the upper spacers 114 to contacting the sacrificial material 116. Additionally, item 207D in FIG. 20, these method form outer spacers 150 (e.g., low-K spacer such as SiCO) on an upper portion of the conformal insulating material 152 that is distal to the substrate 100 from where the two right angles are located. The outer spacers 150 and a lower portion of the conformal insulating material 152 (that contacts sidewalls of the upper spacers 114) form a straight line (extending vertically in the height direction from (perpendicular to) the top surface of the substrate 100) because the outer edges of the outer spacers 150 are aligned with the outer edges of the insulating material 152.

Figure 19A:
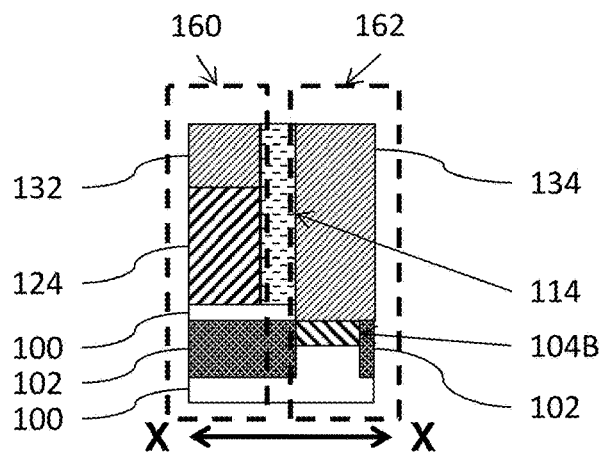
Figure 19B:
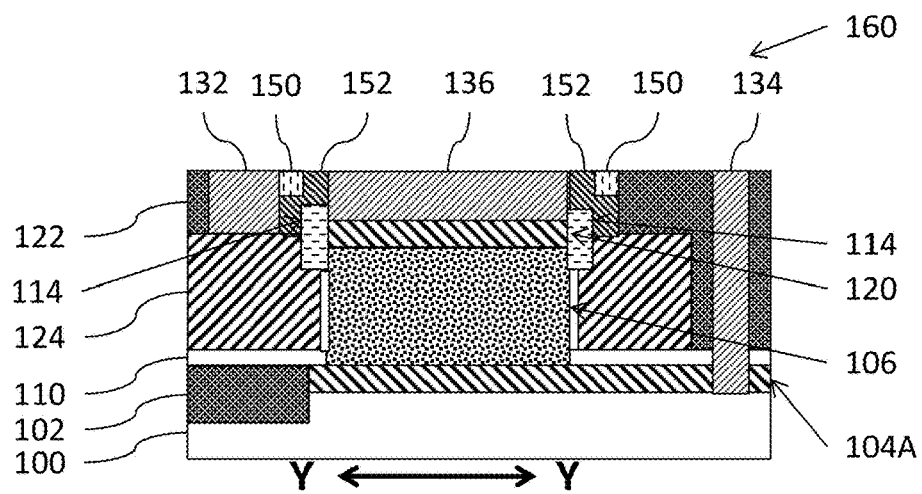
Figure 19C:
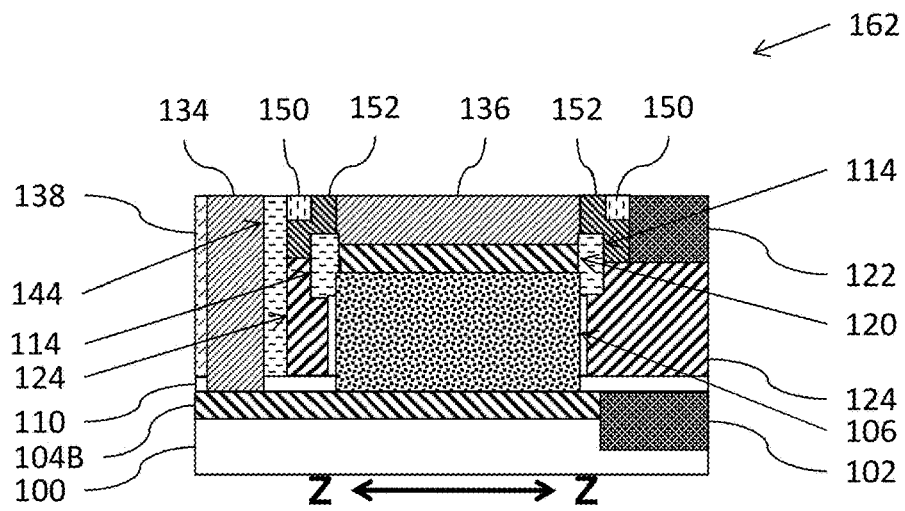
Figure 20:
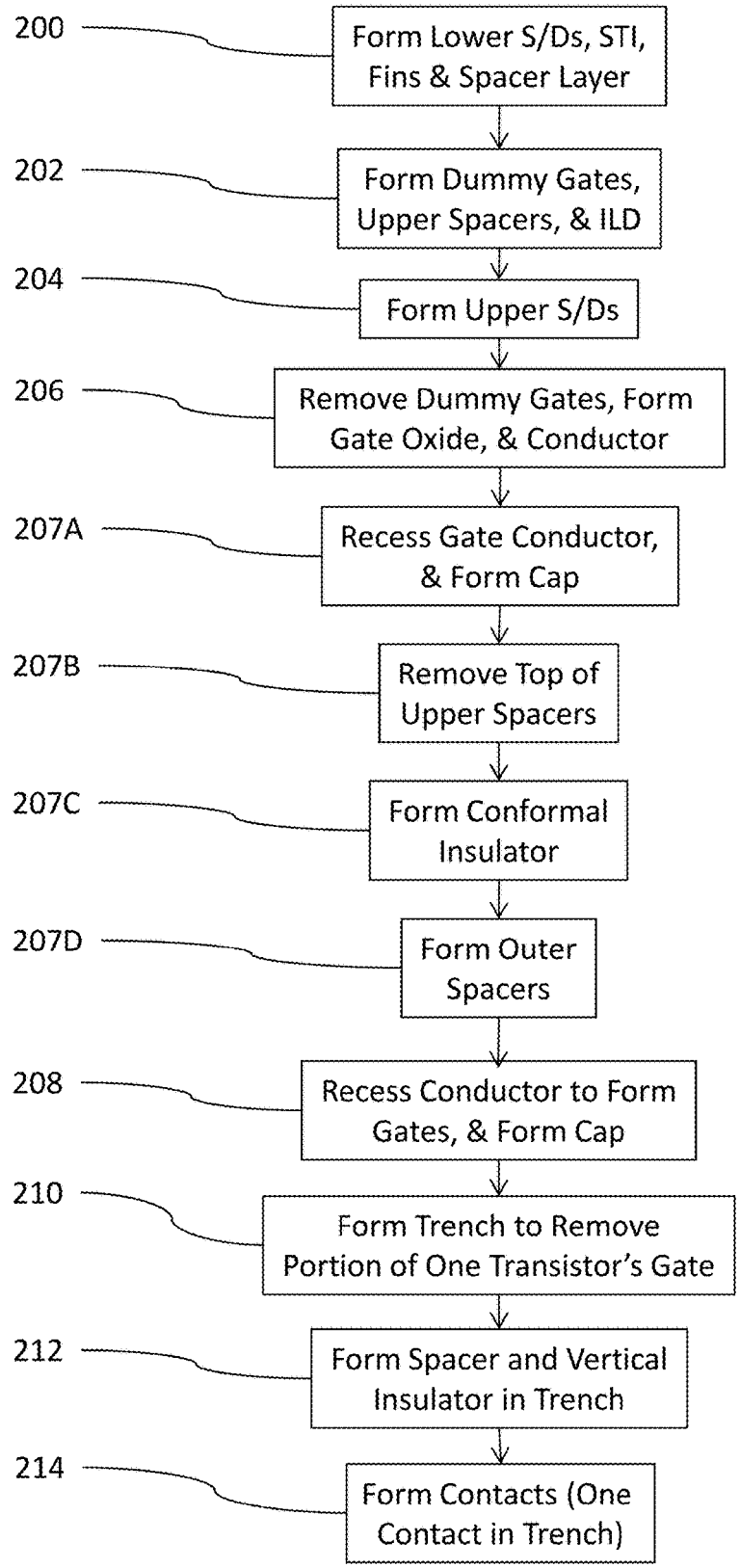
FIG. 20 is a flow diagram illustrating embodiments herein.

Then the remaining processing discussed above with respect to FIGS. 7A-14C are preformed in items 208-214 to create the structure shown in FIGS. 19A-19C. Note that the view in FIG. 19B has been expanded, relative to the other drawings, to illustrate the additional contacts, similar to FIG. 14B. The L- or Z-shaped conformal insulating material 152 and outer spacers 150 increase the thickness of the insulator around the upper S/D contacts 136, which reduces the possibility of the other contacts 132, 134 short-circuiting with the upper S/D contacts 136. In other alternatives, the upper spacers 114 can be formed to a desired thickness, potentially in combination with insulating material 152 and outer spacers 150, to assist in further preventing short circuits.

Such methods produce various integrated circuit structures that include, among other components, a first vertical field effect transistor (VFET) 160 and a second VFET 162 on a substrate 100. The first VFET 160 and the second VFET 162 are parallel and adjacent to one another, and the first VFET 160 and the second VFET 162 each include: a fin-shaped semiconductor 106 extending from the substrate 100; a lower source/drain (S/D) element in the substrate 100 contacting a first surface of the fin-shaped semiconductor 106 that is adjacent the substrate 100; an upper S/D element 120 contacting the top surface of the fin-shaped semiconductor 106 that is distal to the substrate 100; a gate oxide contacting sidewalls of the fin-shaped semiconductor 106; a gate conductor 124 contacting the gate oxide; a gate contact 132 connected to and the gate conductor 124; an upper S/D contact 136 connected to the upper S/D element 120; a lower S/D contact 134 connected to the lower S/D element 104A-B; and upper spacers 114 on upper portions of sidewalls of the fin-shaped semiconductor 106.

The upper portions of sidewalls of the fin-shaped semiconductor 106 are distal to the location where the semiconductor 106 fin contacts the lower S/D element 104A-B. The upper spacers 114 are elongated, straight, and extend away from the substrate 100 in a height direction above the top of the fin-shaped semiconductor 106 that is distal to the lower S/D element 104A-B, and the upper S/D element 120 is on the top of the fin-shaped semiconductor 106 between the upper spacers 114. The first VFET 160 and the second VFET 162 each further include a spacer layer 110 on the lower S/D element 104A-B, where the isolation spacer 138 contacts the spacer layer 110.

The first VFET 160 and the second VFET 162 each further include a cap insulator 122 on the gate conductor 124, where the gate contacts 132 are formed through the cap insulator 122.

The cap insulator 122 and the vertical insulator 144 are different materials from the isolation spacer 138. For example, the cap insulator 122 and the vertical insulator 144 can be silicon dioxide ($SiO_2$) or silicon nitride (SiN), while the isolation spacer 138 is generally silicon carbide (SiC) or silicon-oxycarbide (SiCO). The vertical insulator 144 prevents short circuits between the gate conductor 124 of the first VFET 160 and the lower S/D contact 134 of the second VFET 162.

Further, as shown in FIGS. 14A-14C, the vertical insulator 144 contacts, and is laterally adjacent to, the gate conductor 124 of the second VFET 162, and extends from the lower spacer 110 of the second VFET 162 in a vertical direction that is generally perpendicular to the plane of the lower spacer 110. Also, the lower S/D contact 134 of the second VFET 162 contacts, and is laterally adjacent to (parallel to), the vertical insulator 144 and extends through the lower spacer 110 to the lower S/D element 104B of the second VFET 162. FIGS. 14A-14C also show that the isolation spacer 138 contacts, and is laterally adjacent to (parallel to), the lower S/D contact 134 of the second VFET 162 and extends from the lower spacer 110 of the second VFET 162.

Alternative structures further include a conformal insulating material 152 on the upper spacers 114 and the sidewalls of the sacrificial material 116. The conformal insulating material 152 contains two right angles in cross-section where the conformal insulating material 152 transitions from contacting the upper spacers 114 to contacting the upper S/D contact 136. These structures also include an isolation spacer 138 contacting a gate conductor 124 of the second VFET 162 and the lower S/D contact 134 of the second VFET 162. The first VFET 160 and the second VFET 162 each further include outer spacers 150 on an upper portion of the conformal insulating material 152 that is distal to the substrate 100 from where the two right angles are located, and the outer spacers 150 and a lower portion of the conformal insulating material 152 that contacts sidewalls of the upper spacers 114 form a straight line.

The first VFET 160 and the second VFET 162 discussed above can be the same or different types of transistors (e.g., complementary, oppositely doped (positive, negative)). A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

A hardmask can be formed of any suitable material, whether now known or developed in the future, such as a metal or organic hardmask, that has a hardness greater than the substrate and insulator materials used in the remainder of the structure. For purposes herein, sidewall spacers are structures that are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other element separating the described element). The term "laterally" is used herein to describe the relative locations of element and, more particularly, to indicate that an element is positioned to the side of another element as opposed to above or below the other element, as those elements is oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit element, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function element in the claims below are intended to include any structure, material, or act for performing the function in combination with other claimed element as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the element herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the element of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:

forming a first vertical field effect transistor (VFET) and a second VFET on a substrate, wherein the first VFET and the second VFET are parallel and adjacent to one another, and the first VFET and the second VFET each comprise: a fin-shaped semiconductor extending from the substrate; a lower source/drain (S/D) element in the substrate contacting a first surface of the fin-shaped semiconductor that is adjacent the substrate; an upper S/D element contacting an opposite surface of the fin-shaped semiconductor that is distal to the substrate; and a gate conductor laterally adjacent the fin-shaped semiconductor;

removing a portion of a gate conductor of the second VFET that is positioned over a lower S/D element of the second VFET to leave a trench;

forming a vertical insulator in a first portion of the trench, contacting the gate conductor of the second VFET and adjacent the first VFET, thereby creating a second portion of the trench that is insulated from the gate conductors of the first and second VFETs, and forming an isolation spacer in the second portion of the trench;

creating an opening in the second portion of the trench by selectively removing a portion of the isolation spacer relative to the vertical insulator in the first portion of the trench; and forming a lower S/D contact of the second VFET on the lower S/D element of the second VFET in the opening, forming a lower S/D contact of the first VFET to a lower S/D element of the first VFET, and forming contacts to the upper S/D element and the gate conductor of the first VFET and the second VFET.

2. The method according to claim 1, further comprising forming a cap insulator on the gate conductor of the first VFET and the second VFET before removing the portion of the gate conductor of the second VFET, wherein contacts to a gate conductor of the first VFET and the gate conductor of the second VFET are formed through the cap insulator.

3. The method according to claim 1, wherein the vertical insulator and the isolation spacer are made of different materials.

4. The method according to claim 1, further comprising forming upper spacers on upper portions of sidewalls of the fin-shaped semiconductor, wherein the upper portions of the sidewalls of the fin-shaped semiconductor are distal to a location where the fin-shaped semiconductor contacts the lower S/D element, and wherein the upper spacers are elongated, straight, and extend away from the substrate in a height direction above a top of the fin-shaped semiconductor that is distal to the lower S/D element.

5. The method according to claim 4, further comprising forming a conformal insulating material on the upper spacers so that the conformal insulating material contains two right angles in cross-section.

6. The method according to claim 1, wherein forming the first and second VFET further comprises forming a spacer layer on the lower S/D element of the first VFET and the lower S/D element of the second VFET, wherein the isolation spacer contacts the spacer layer.

7. The method according to claim 1, wherein the vertical insulator prevents short circuits between a gate conductor of the first VFET and the lower S/D contact of the second VFET.

8. A method comprising:

forming a first vertical field effect transistor (VFET) and a second VFET on a substrate, wherein the first VFET and the second VFET are parallel and adjacent to one another, and the first VFET and the second VFET each comprise: a fin-shaped semiconductor extending from the substrate; a lower source/drain (S/D) element in the substrate contacting a first surface of the fin-shaped semiconductor that is adjacent the substrate; an upper S/D element contacting a top of the fin-shaped semiconductor that is distal to the substrate; and a gate conductor laterally adjacent the fin-shaped semiconductor;

forming upper spacers on upper portions of sidewalls of the fin-shaped semiconductor, wherein the upper portions of the sidewalls of the fin-shaped semiconductor are distal to a location where the fin-shaped semiconductor contacts the lower S/D element, wherein the upper spacers are elongated and extend away from the substrate in a height direction above the top of the fin-shaped semiconductor that is distal to the lower S/D element, and wherein the upper S/D element is on the top of the fin-shaped semiconductor between the upper spacers;

recessing the gate conductor to expose a top portion of the upper spacers that are distal to the substrate;

removing a portion of a second gate conductor of the second VFET that is positioned over a lower S/D element of the second VFET to leave a trench;

forming a vertical insulator in a first portion of the trench, to contact the gate conductor of the second VFET;

forming an isolation spacer in a second portion of the trench;

forming a lower S/D contact of the second VFET on the lower S/D element of the second VFET in the isolation spacer;

forming a lower S/D contact of the first VFET to a lower S/D element of the first VFET; and forming contacts to the upper S/D element and the gate conductor of the first VFET and the second VFET.

9. The method according to claim 8, further comprising forming a cap insulator on the gate conductor of the first VFET and the second VFET before removing the portion of the gate conductor of the second VFET, wherein contacts to a gate conductor of the first VFET and the gate conductor of the second VFET are formed through the cap insulator.

10. The method according to claim 8, wherein the vertical insulator and the isolation spacer are made of different materials.

11. The method according to claim 8, wherein the upper spacers are straight, and wherein the method further comprises forming a conformal insulating material on the upper spacers so that the conformal insulating material contains two right angles in cross-section.

12. The method according to claim 11, wherein forming the first and second VFETs further comprises forming outer spacers on an upper portion of the conformal insulating material that is distal to the substrate,
   wherein the outer spacers and a lower portion of the conformal insulating material that contacts sidewalls of the upper spacers form a straight line.

13. The method according to claim 8, further comprising forming a spacer layer on the lower S/D element of the first VFET and the lower S/D element of the second VFET, wherein the isolation spacer contacts the spacer layer.

14. The method according to claim 8, wherein the vertical insulator prevents short circuits between a gate conductor of the first VFET and the lower S/D contact of the second VFET.

\* \* \* \* \*